(12) United States Patent
Miyanishi

(10) Patent No.: US 7,898,896 B2
(45) Date of Patent: Mar. 1, 2011

(54) SEMICONDUCTOR DEVICE

(75) Inventor: Atsushi Miyanishi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/410,868

(22) Filed: Mar. 25, 2009

(65) Prior Publication Data

US 2009/0185431 A1 Jul. 23, 2009

Related U.S. Application Data

(62) Division of application No. 11/508,288, filed on Aug. 23, 2006, now abandoned.

(30) Foreign Application Priority Data

Aug. 26, 2005 (JP) ............................. 2005-246408

(51) Int. Cl.
*G11C 8/00* (2006.01)
(52) U.S. Cl. .................. 365/230.05; 365/154; 365/156; 365/189.05
(58) Field of Classification Search ................ 365/154, 365/156, 230.05, 189.05
See application file for complete search history.

(56) References Cited

U.S. PATENT DOCUMENTS 5,701,267 A 12/1997 Masuda et al.

6,181,634 B1 * 1/2001 Okita .................... 365/230.05
7,009,246 B2 3/2006 Kawata et al.

FOREIGN PATENT DOCUMENTS

| JP | 05-074198 | 3/1993 |
|----|-----------|--------|
| JP | 09-054142 | 2/1997 |
| JP | 2001-023400 | 1/2001 |

* cited by examiner

*Primary Examiner*—Amir Zarabian
*Assistant Examiner*—Kretelia Graham
(74) *Attorney, Agent, or Firm*—McDermott Will & Emery LLP

(57) ABSTRACT

The present invention provides a technique capable of simplifying a layout structure of a semiconductor device having a semiconductor memory section in which an input port and an output port are separated from each other, and which includes a bypass function. In a semiconductor memory device to be used as a semiconductor memory section of the semiconductor device, in a bypass mode, an output buffer outputs input data transmitted through a bypass line, extending from an input buffer circuit to the output buffer circuit, to an output port. In the layout structure of the semiconductor memory device, in plan view, a memory cell array is arranged between the input buffer circuit and the output buffer circuit, and a bypass line is arranged through between the memory cell arrays.

4 Claims, 18 Drawing Sheets

F I G . 3
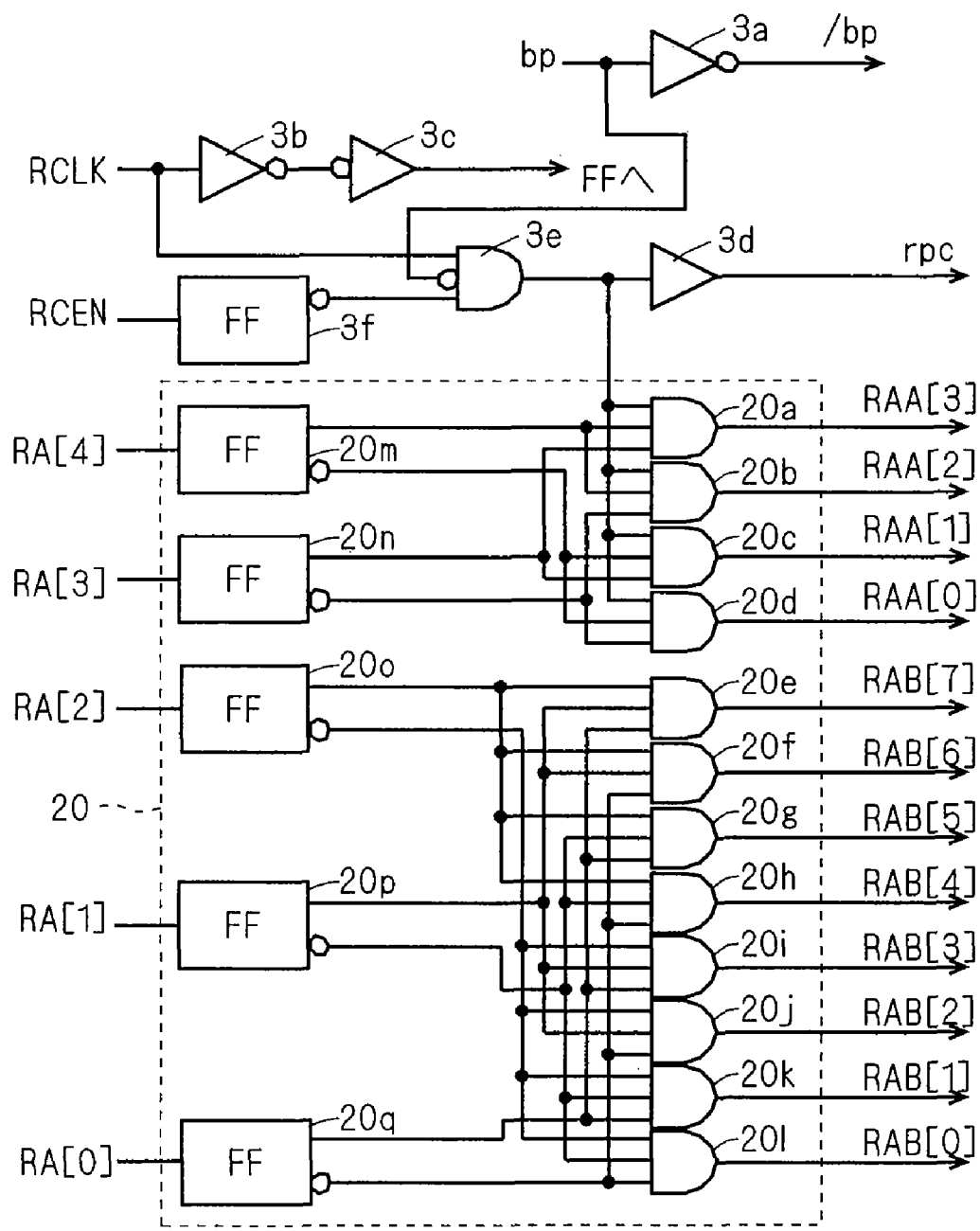

F I G . 1 4
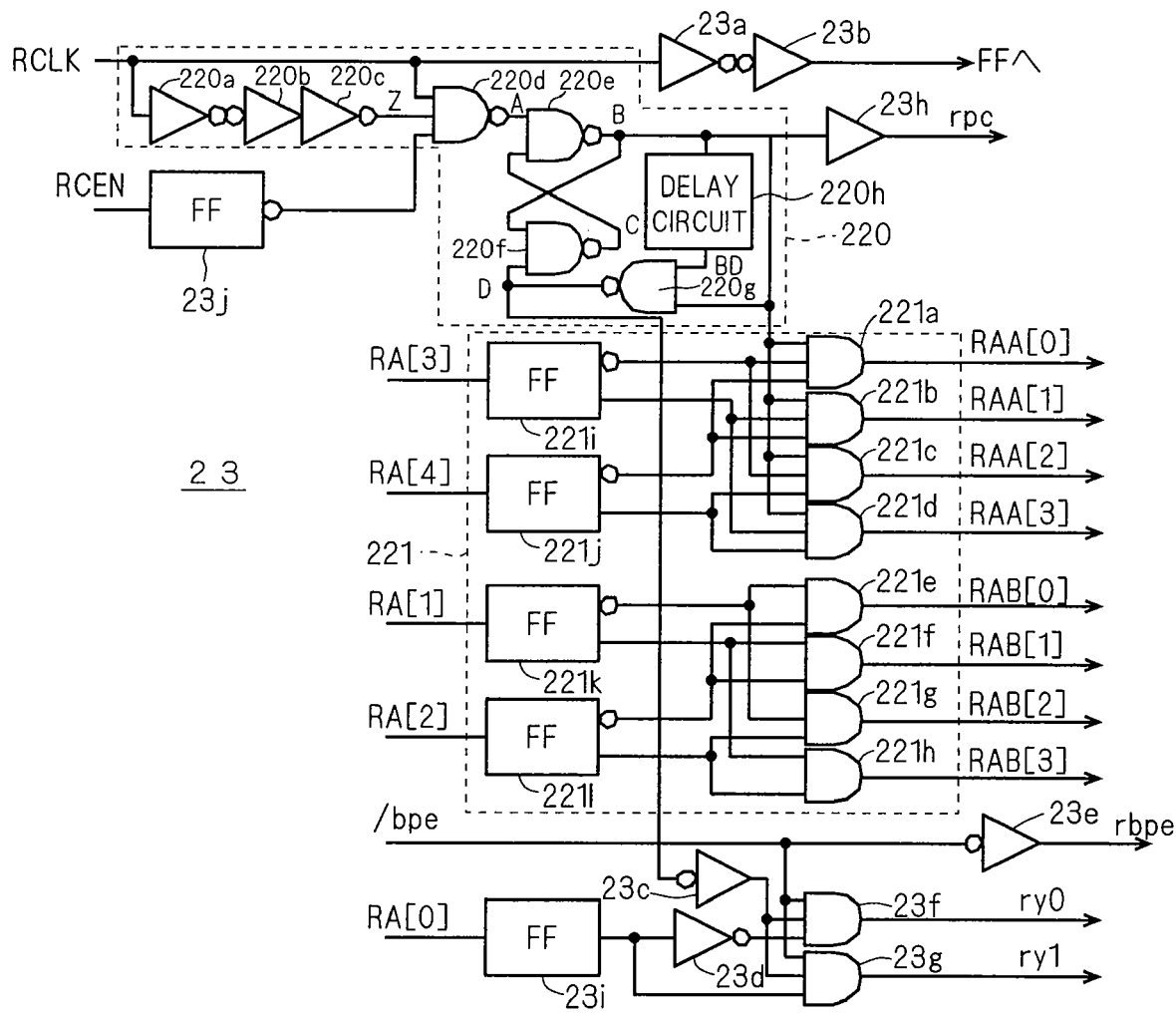

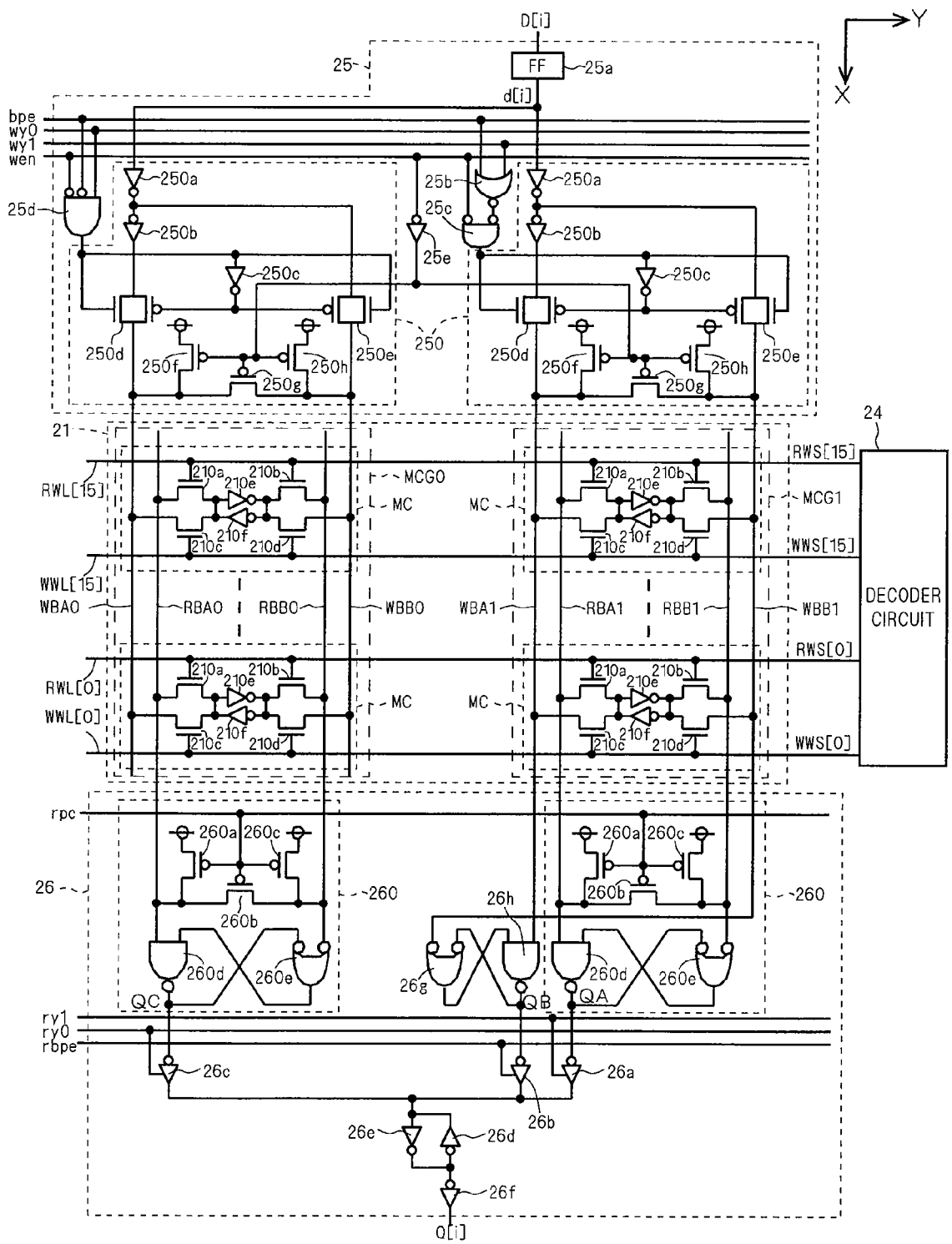
F I G . 1 6

FIG. 17
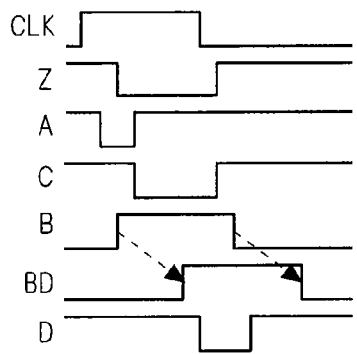
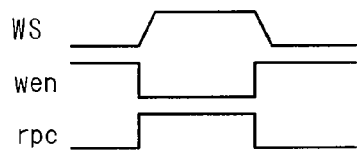
FIG. 18
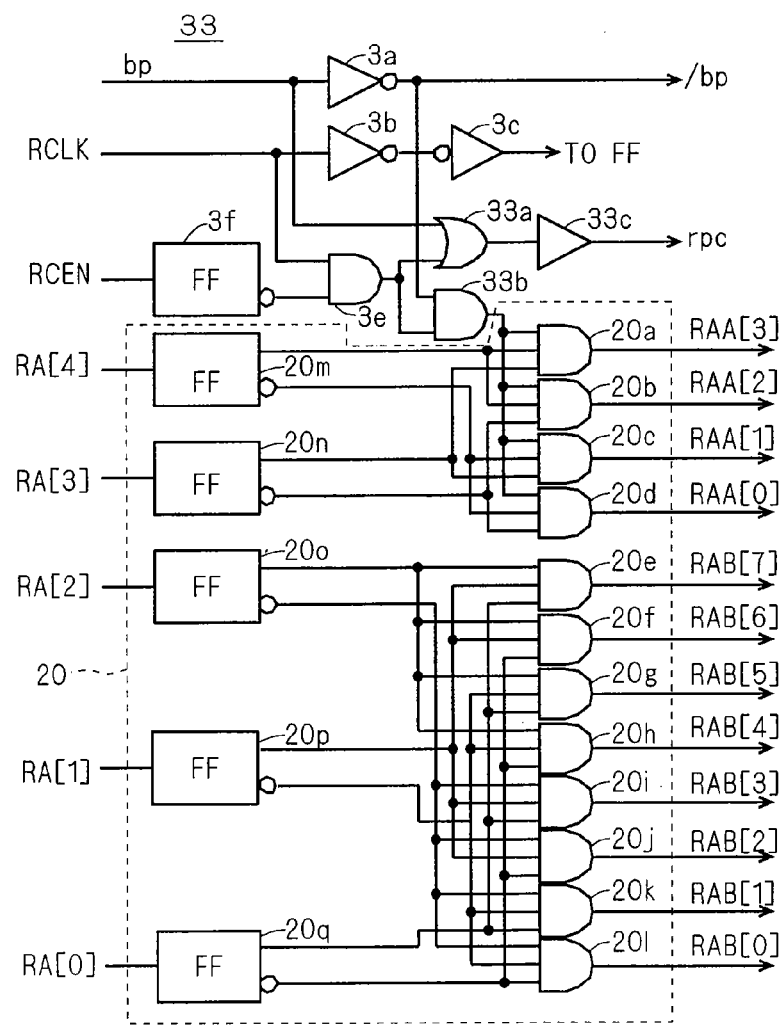

SEMICONDUCTOR DEVICE

RELATED APPLICATIONS

This application is a Divisional of U.S. application Ser. No. 11/508,288, filed Aug. 23, 2006, now abandoned claiming priority of Japanese Application No. 2005-246408, filed Aug. 26, 2005, the entire contents of each of which are hereby incorporated by reference.

BACKGROUND OF THE INVENTION

1. Field of the Invention

The present invention relates to a semiconductor device including a semiconductor memory section with its input port and output port separated from each other.

2. Description of the Background Art

There have hitherto been proposed a variety of techniques regarding a multi-port memory with its input port and output port separated from each other. For example, Japanese Patent Application Laid-Open No. 09-54142 (1997) discloses a technique of arranging a bypass means of outputting data, having been inputted into an input port, directly to an output port to perform a test on a semiconductor memory device by use of the bypass means.

Further, other techniques regarding a semiconductor memory device are described in Japanese Patent Application Laid-Open Nos. 2001-23400 and 05-74198 (1993).

As in the technique described in Japanese Patent Application Laid-Open No. 09-54142 (1997), when the bypass function of outputting data, having been inputted into the input port, directly to the output port is to be realized in the semiconductor memory device, it is necessary to make a layout system as little complex as possible for size reduction of the device or simplification of the device production process.

While Japanese Patent Application Laid-Open No. 09-54142 (1997) describes a technique of arranging the input port and the output port to be close to each other in a layout, it does not describe a specific layout for arranging the bypass means. It is therefore not possible to obtain an optimum layout system from the technique of Japanese Patent Application Laid-Open No. 09-54142 (1997).

SUMMARY OF THE INVENTION

An object of the present invention is to provide a technique capable of simplifying a layout structure of a semiconductor device having a semiconductor memory section in which an input port and an output port are separated from each other, and which includes a bypass function.

A first semiconductor device of the present invention is a semiconductor device including a semiconductor memory section that has a write mode, a read mode and a bypass mode. The semiconductor memory section includes first and second memory cell arrays, first and second input ports, first and second output ports, a plurality of read word lines, a plurality of write word lines, a decoder circuit, first and second input buffer circuits, first and second write bit lines, first and second output buffer circuits, first and second read bit lines, and first and second bypass lines. The first and second memory cell arrays each have a plurality of memory cells arranged in a predetermined direction. The first and second input ports are respectively provided corresponding to the first and second memory cell arrays and data are inputted into the first and second input ports. The first and second output ports are respectively provided corresponding to the first and second memory cell arrays and data are outputted from the first and second output ports. The plurality of read word lines are respectively connected to the plurality of memory cells in each of the first and second memory cell arrays. The plurality of write word lines are respectively connected to the plurality of memory cells in each of the first and second memory cell arrays. The decoder circuit activates any one of the plurality of write word lines in the write mode, and activates any one of the plurality of read word lines in the read mode. The first and second input buffer circuits respectively receive data having been inputted into the first and second input ports, and output the received data. The first write bit line extends from the first input buffer circuit to the first memory cell array, and transmits data outputted from the first input buffer circuit to the first memory cell array. The second write bit line extends from the second input buffer circuit to the second memory cell array, and transmits data outputted from the second input buffer circuit to the second memory cell array. The first and second output buffer circuits respectively output the received data to the first and second output ports. The first read bit line extends from the first memory cell array to the first output buffer circuit, and transmits data from the first memory cell array to the first output buffer circuit. The second read bit line extends from the second memory cell array to the second output buffer circuit, and transmits data from the second memory cell array to the second output buffer circuit. The first bypass line extends from the first input buffer circuit to the first output buffer circuit, and transmits data, having been inputted into the first input buffer circuit from the first input port, to the first output buffer circuit. The second bypass line extends from the second input buffer circuit to the second output buffer circuit, and transmits data, having been inputted into the second input buffer circuit from the second input port, to the second output buffer circuit. The first output buffer circuit outputs data transmitted through the first read bit line to the first output port in the read mode, and outputs data transmitted through the first bypass line to the first output port in the bypass mode. The second output buffer circuit outputs data transmitted through the second read bit line to the second output port in the read mode, and outputs data transmitted through the second bypass line to the second output port in the bypass mode. In the layout structure in plan view, the first memory cell array is arranged between the first input buffer circuit and the first output buffer circuit, the second memory cell array is arranged between the second input buffer circuit and the second output buffer circuit, and the first bypass line is arranged through between the first and second memory cell arrays.

Since the first bypass line is arranged through between the first and second memory cell arrays in the layout structure in plan view, it is possible to install wiring of the first bypass line without effects of the layout structure within the region where the memory cell array is formed. This can result simplification of the layout structure, thereby allowing size reduction of the device and simplification of the device production process. Further, it is possible to reduce an effect exerted on data, transmitted through the first bypass line, by the wiring potential within the region where the memory cell array is formed.

A second semiconductor device of the present invention is a semiconductor device including a semiconductor memory section that has a write mode, a read mode and a bypass mode. The semiconductor memory section includes a memory cell array, an input port into which data is inputted, an output port from which data is outputted, a plurality of read word lines, a plurality of write word lines, a decoder circuit, an input buffer circuit, a write bit line, an output buffer circuit, a read bit line, a bypass line, power wiring, and ground wiring. The memory cell array has a plurality of memory cells arranged in a predetermined direction. The plurality of read word lines are respectively connected to the plurality of memory cells in the memory cell array. The plurality of write word lines are respectively connected to the plurality of memory cells in the memory cell array. The decoder circuit activates any one of the plurality of write word lines in the write mode, and activates any one of the plurality of read word lines in the read mode. The input buffer circuit receives data having been inputted into the input port, and outputs the received data. The write bit line extends from the input buffer circuit to the memory cell array, and transmits data outputted from the input buffer circuit to the memory cell array. The output buffer circuit outputs received data to the output port. The read bit line extends from the memory cell array to the output buffer circuit, and transmits data from the memory cell array to the output buffer circuit. The bypass line extends from the input buffer circuit to the output buffer circuit, and transmits data, having been inputted into the input buffer circuit from the input port, to the output buffer circuit. The power wiring gives a power potential to the memory cell array. The ground wiring gives a ground potential to the memory cell array. The output buffer circuit outputs data transmitted through the read bit line to the output port in the read mode, and outputs data transmitted through the bypass line to the output port in the bypass mode. In the layout structure in plan view, the bypass line, the write bit line, the read bit line, the power wiring and the ground wiring are arranged on a region where the plurality of memory cells are formed in the memory cell array.

In the layout structure where the memory cell array is arranged between the input buffer circuit and the output buffer circuit, it is possible to simplify the layout structure since the bypass line, the write bit line, the read bit line, the power wiring and the ground wiring are arranged on a region where the plurality of memory cells are formed in the memory cell array. This can result in size reduction of the device and simplification of the device production process.

A third semiconductor device of the present invention is a semiconductor device including a semiconductor memory section that has a write mode, a read mode and a bypass mode. The semiconductor memory section includes a memory cell array, an input port into which data is inputted, an output port from which data is outputted, a plurality of read word lines, a plurality of write word lines, a decoder circuit, an input buffer circuit, a write bit line, an output buffer circuit, and a read bit line. The memory cell array has a plurality of memory cells arranged in a predetermined direction. The plurality of read word lines are respectively connected to the plurality of memory cells in the memory cell array. The plurality of write word lines are respectively connected to the plurality of memory cells in the memory cell array. The decoder circuit activates any one of the plurality of write word lines in the write mode, and activates any one of the plurality of read word lines in the read mode. The input buffer circuit receives data having been inputted into the input port, and outputs the received data. The write bit line extends from the input buffer circuit to the memory cell array, and transmits data outputted from the input buffer circuit to the memory cell array. The output buffer circuit outputs received data to the output port. The read bit line extends from the memory cell array to the output buffer circuit, and transmits data from the memory cell array to the output buffer circuit. The write bit line is extended from the memory cell array to the output buffer circuit. The output buffer circuit outputs data transmitted through the read bit line to the output port in the read mode, and outputs data transmitted through the write bit line to the output port in the bypass mode.

Extension of the write bit line from the memory cell array to the output buffer circuit enables output of data, having been inputted into the input port, as it is to the output port. In this manner, the bypass function is realized by use of the write bit line, thereby allowing simplification of the layout structure. This can result in size reduction of the device and simplification of the device production process.

A fourth semiconductor device of the present invention is a semiconductor device including a semiconductor memory section that has a write mode, a read mode and a bypass mode. The semiconductor memory section includes a memory cell array, an input port into which data is inputted, an output port from which data is outputted, a plurality of read word lines, a plurality of write word lines, a decoder circuit, an input buffer circuit, a write bit line, an output buffer circuit, and a read bit line. The memory cell array has a plurality of memory cells arranged in a predetermined direction. The plurality of read word lines are respectively connected to the plurality of memory cells in the memory cell array. The plurality of write word lines are respectively connected to the plurality of memory cells in the memory cell array. The decoder circuit activates any one of the plurality of write word lines in the write mode, and activates any one of the plurality of read word lines in the read mode. The input buffer circuit receives data having been inputted into the input port, and outputs the received data. The write bit line extends from the input buffer circuit to the memory cell array, and transmits data outputted from the input buffer circuit to the memory cell array. The output buffer circuit outputs received data to the output port. The read bit line extends from the memory cell array to the output buffer circuit, and transmits data from the memory cell array to the output buffer circuit. The read bit line is extended from the memory cell array to the input buffer circuit. The input buffer circuit outputs data, having been inputted into the input port, not to the read bit line but to the write bit line in the write mode, and outputs data, having been inputted into the input port, to the read bit line in the bypass mode.

Extension of the read bit line from the memory cell array to the input buffer circuit enables output of data, having been inputted into the input port, as it is to the output port. In this manner, the bypass function is realized by use of the read bit line, thereby allowing simplification of the layout structure. This can result in size reduction of the device and simplification of the device production process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a view showing a circuit configuration of a read control circuit according to the first embodiment of the present invention;

FIG. 14 is a view showing a circuit configuration of a read control circuit according to the third embodiment of the present invention;

FIG. 16 is a view showing a circuit configuration and a layout structure in plan view of a memory cell array, an input buffer circuit and an output buffer circuit according to the third embodiment of the present invention;

FIG. 17 is a timing chart showing operations of the writhe control circuit and the read control circuit according to the third embodiment of the present invention;

FIG. 18 is a view showing a circuit configuration of a read control circuit according to a fourth embodiment of the present invention.

DESCRIPTION OF THE PREFERRED EMBODIMENTS

First Embodiment

Figure 1:
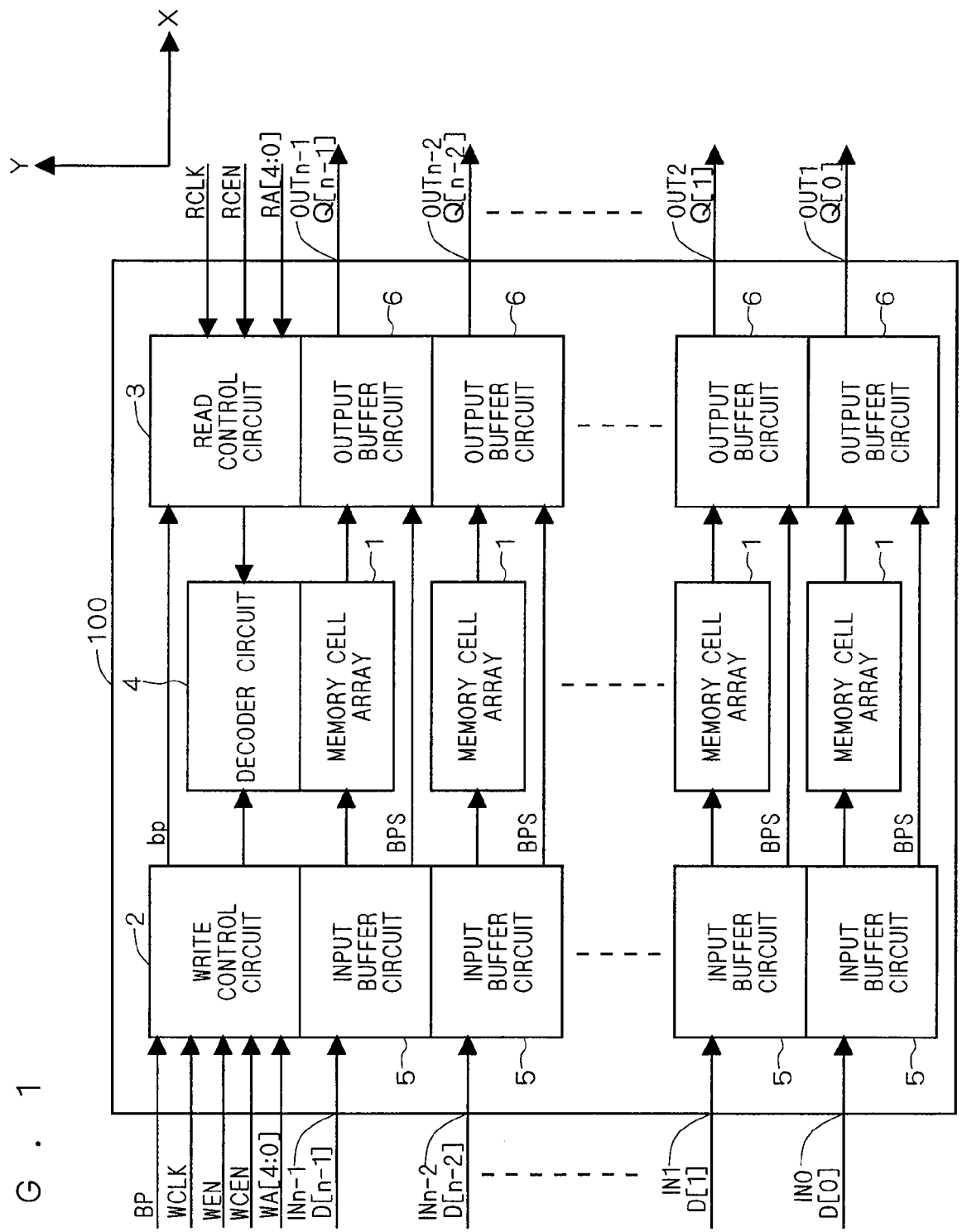
FIG. 1 is a plan view showing a layout structure of a semiconductor memory device according to a first embodiment of the present invention.

FIG. 1 is a plan view schematically showing a layout structure of a semiconductor memory device 100 according to a first embodiment of the present invention. As shown in FIG. 1, the semiconductor memory device 100 according to the first embodiment includes: n input ports ($n \geq 1$) IN0 to INn−1; n output ports OUT0 to OUTn−1; a write control circuit 2; a read control circuit 3; and a decoder circuit 4. Further, the semiconductor memory device according to the first embodiment is provided with n groups each consisting of one memory cell array 1, one input buffer circuit 5 and one output buffer circuit 6.

n-bit input data D[n−1:0] is inputted into the semiconductor memory device 100, and n-bit output data Q[n−1:0] is outputted from the semiconductor memory device 100. Input data D[0] to D[n−1] are respectively inputted into the input ports IN0 to INn−1, and output data Q[0] to Q[n−1] are respectively outputted from the output ports OUT0 to OUTn−1.

Input data D[i] among the n-bit input data D[n−1:0] is inputted into one of the input buffer circuits 5 through an input port INi. Output data Q[i] is outputted from one of the output buffer circuits 6 which belongs to the same group as the input buffer circuit 5 into which the input data D [i] is inputted. The output data Q[i] is outputted to the outside of the semiconductor memory device 100 through an output port OUTi. It is to be noted that "i" is an arbitrary integer satisfying ($0 \leq i \leq n$).

In the layout structure of the semiconductor memory device 100 according to the first embodiment, the input buffer circuit 5, the memory cell array 1 and the output buffer circuit 6, which constitute one group, are arranged in this order along the x-axis direction in plan view, as shown in FIG. 1. Therefore, in the layout structure in plan view, the memory cell array 1 is arranged so as to be sandwiched between the input buffer circuit 5 and the output buffer circuit 6 which belong to the same group as the memory cell array 1.

Further, in the layout structure of the semiconductor memory device 100, the write control circuit 2 and n input buffer circuits 5 are arranged in a row along the Y-axis direction perpendicular to the X-direction. The decoder circuit 4 and n memory cell arrays 1 are arranged in a row along the Y-axis direction. The read control circuit 3 and n output buffer circuits 6 are arranged in a row along the Y-axis direction. Further, the write control circuit 2, the decoder circuit 4 and the read control circuit 3 are arranged in this order along the X-axis direction.

Figure 2:
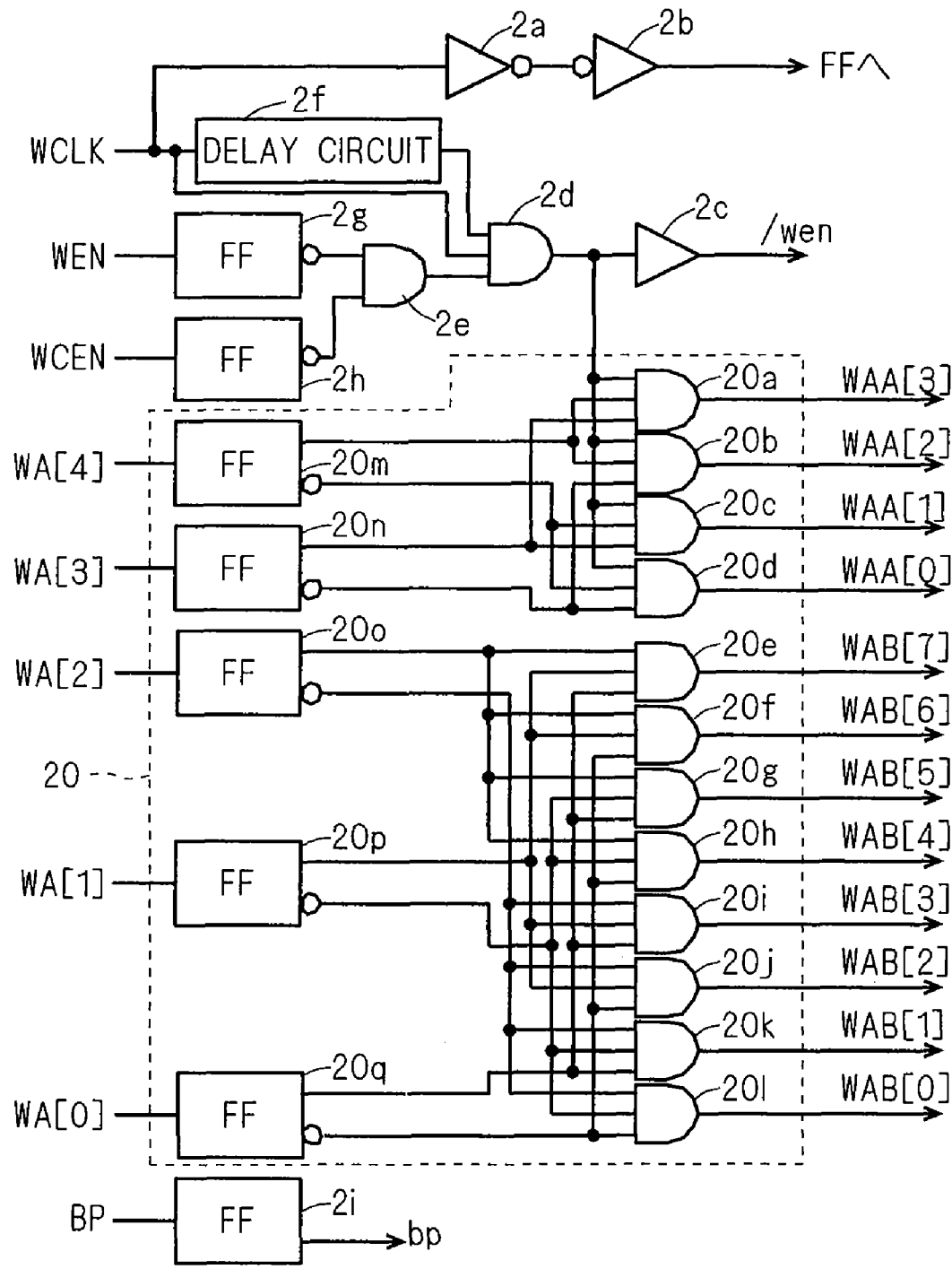
FIG. 2 is a view showing a circuit configuration of a write control circuit according to the first embodiment of the present invention.

FIG. 2 is a view showing a circuit configuration of the write control circuit 2. The write control circuit 2 operates in synchronization with a write clock signal WCLK supplied from the outside of the semiconductor memory device 100, and controls operations of the input buffer circuit 5 and the memory cell array 1, to control writing of the input data D[n−1:0] into the memory cell array 1 in the semiconductor memory device 100.

As shown in FIG. 2, the write control circuit 2 includes inverter circuits 2a, 2b, a buffer circuit 2c, AND circuits 2d, 2e, a delay circuit 2f, a flip flop circuits (denoted with "FF" in the figure) 2g to 2i, and an internal address production circuit 20. It should be noted that in this specification, a flip flop circuit means a delay flip flop circuit (D-FF).

The inverter circuit 2a inverts a clock signal WCLK and outputs the inverted signal. The inverter circuit 2b inverts the output of the inverter circuit 2a and outputs the inverted signal. The output of the inverter circuit 2b is inputted in CLK input terminals of all the flip flop circuits in the write control circuit 2. The delay circuit 2f delays the write clock signal WCLK by prescribed time, and outputs the delayed signal. A write control signal WEN and a write cell selection control signal WCEN are respectively inputted into D input terminals of the flip flop circuits 2g, 2h. The AND circuit 2e computes a conjunction of Q-bar output of the flip flop circuit 2g and Q-bar output of the flip flop circuit 2h, and then outputs the conjunction. The AND circuit 2d computes a conjunction of the output of the delay circuit 2f, the write clock signal WCLK and the output of the AND circuit 2e, and then outputs the conjunction. The buffer circuit 2c outputs the output of the AND circuit 2d with its logic level remained as an inversion write control signal /wen. A bypass control signal BP is inputted as an internal bypass control signal into a D input terminal of the flip flop circuit 2i, and Q output of the flip flop circuit 2i is inputted into the read control circuit 3.

The internal address production circuit 20 includes AND circuits 20a to 20l, and flip flop circuits 20m to 20q. Write address signals WA[0] to WA[4] are respectively inputted into D input terminals of the flip flop circuits 20*q*, 20*p*, 20*o*, 20*n*, 20*m*. The AND circuit 20*a* computes a conjunction of the output of the AND circuit 2*d* and Q output of the flip flop circuits 20*m*, 20*n*, and then outputs the conjunction as an internal write address signal WAA[3]. The AND circuit 20*b* computes a conjunction of the output of the AND circuit 2*d*, Q output of the flip flop circuit 20*m* and Q-bar output of the flip flop circuit 20*n*, and then outputs the conjunction as an internal write address signal WAA[2]. The AND circuit 20*c* computes a conjunction of the output of the AND circuit 2*d*, Q-bar output of the flip flop circuit 20*m* and Q output of the flip flop circuit 20*n*, and then outputs the conjunction as an internal write address signal WAA[1]. The AND circuit 20*d* computes a conjunction of the output of the AND circuit 2*d* and Q-bar output of the flip flop circuits 20*m*, 20*n*, and then outputs the conjunction as an internal write address signal WAA[0].

The AND circuit 20*e* computes a conjunction of Q output of the flip flop circuits 20*o* to 20*q*, and then outputs the conjunction as an internal write address signal WAB[7]. The AND circuit 20*f* computes a conjunction of Q output of the flip flop circuits 20*o*, 20*p* and Q-bar output of the flip flop circuit 20*q*, and then outputs the conjunction as an internal write address signal WAB[6]. The AND circuit 20*g* computes a conjunction of Q output of the flip flop circuits 20*o*, 20*q* and Q-bar output of the flip flop circuit 20*p*, and then outputs the conjunction as an internal write address signal WAB[5]. The AND circuit 20*h* computes a conjunction of Q output of the flip flop circuit 20*o* and Q-bar output of the flip flop circuit 20*p*, 20*q*, and then outputs the conjunction as an internal write address signal WAB[4]. The AND circuit 20*i* computes a conjunction of Q-bar output of the flip flop circuit 20*o* and Q output of the flip flop circuit 20*p*, 20*q*, and then outputs the conjunction as an internal write address signal WAB[3]. The AND circuit 20*j* computes a conjunction of the Q-bar output of the flip flop circuits 20*o*, 20*q* and the Q output of the flip flop circuit 20*p*, and then outputs the conjunction as an internal write address signal WAB[2]. The AND circuit 20*k* computes a conjunction of the Q-bar output of the flip flop circuit 20*o*, 20*p* and the Q output of the flip flop circuit 20*q*, and then outputs the conjunction as an internal write address signal WAB[1]. The AND circuit 20*l* computes a conjunction of the Q-bar output of the flip flop circuit 20*o* to 20*q*, and then outputs the conjunction as an internal write address signal WAB[0].

It is to be noted that the write control signal WEN, the write cell selection control signal WCEN, the bypass control signal BP and the write address signal WA[4:0], which are inputted into the write control circuit 2, are inputted from the semiconductor memory device 100, as is the clock signal WCLK.

FIG. 3 is a view showing a circuit configuration of the read control circuit 3. The read control circuit 3 operates in synchronization with a read clock signal RCLK supplied from the outside of the semiconductor memory device 100, and controls operations of the output buffer circuit 6 and the memory cell array 1, to control reading of data from the memory cell array 1 in the semiconductor memory device 100.

As shown in FIG. 3, the read control circuit 3 includes inverter circuits 3*a* to 3*c*, a buffer circuit 3*d*, AND circuit 3*e*, a flip flop circuit 3*f*, and the aforesaid internal address production circuit 20. The inverter circuit 3*a* inverts an internal bypass signal bp outputted from the write control circuit 2 and outputs the inverted signal as an inversion bypass control signal /bp. The inverter circuit 3*b* inverts the read clock signal RCLK and outputs the inverted signal. The inverter circuit 3*c* inverts the output of the inverter circuit 3*b* and outputs the inverted signal. The output of the inverter circuit 3*c* is inputted into CLK input terminals of all the flip flop circuits in the read control circuit 3.

A read cell selection control signal RCEN is inputted into a D input terminals of the flip flop circuits 3*f*. The AND circuit 3*e* computes a conjunction of the read clock signal RCLK, Q-bar output of the flip flop circuit 3*f* and the inversion signal of the internal bypass control signal bp. The buffer circuit 3*d* outputs the output of the AND circuit 3*e* with its logic level remained as an internal read control signal rpc Read address signals RA[0] to RA[4] are respectively inputted into D input terminals of flip flop circuits 20*q*, 20*p*, 20*o*, 20*n*, 20*m*. Further, the output of the AND circuit 3*e*, in place of the output of the AND circuit 2*d*, is inputted into each of the AND circuits 20*a* to 20*l*. Then, signals are outputted from the 20*a* to 20*d* respectively as address signals RAA[3], RAA[2], RAA[1], RAA[0], and signals are outputted from the 20*e* to 20*l* respectively as address signals RAB[7], RAB[6], RAB[5], RAB[4], RAB[3], RAB[2], RAB[1], RAB[0]. Other configurations of the internal address production circuit 20 in the read control circuit 3 are the same as those of the internal address production circuit 20 in the write control circuit 2.

It is to be noted that the read cell control signal RCEN and the read address signal RA[4:0], which are inputted into the read control circuit 3, are inputted from the outside of the semiconductor memory device 100, as is the read clock signal RCLK.

Figure 4:
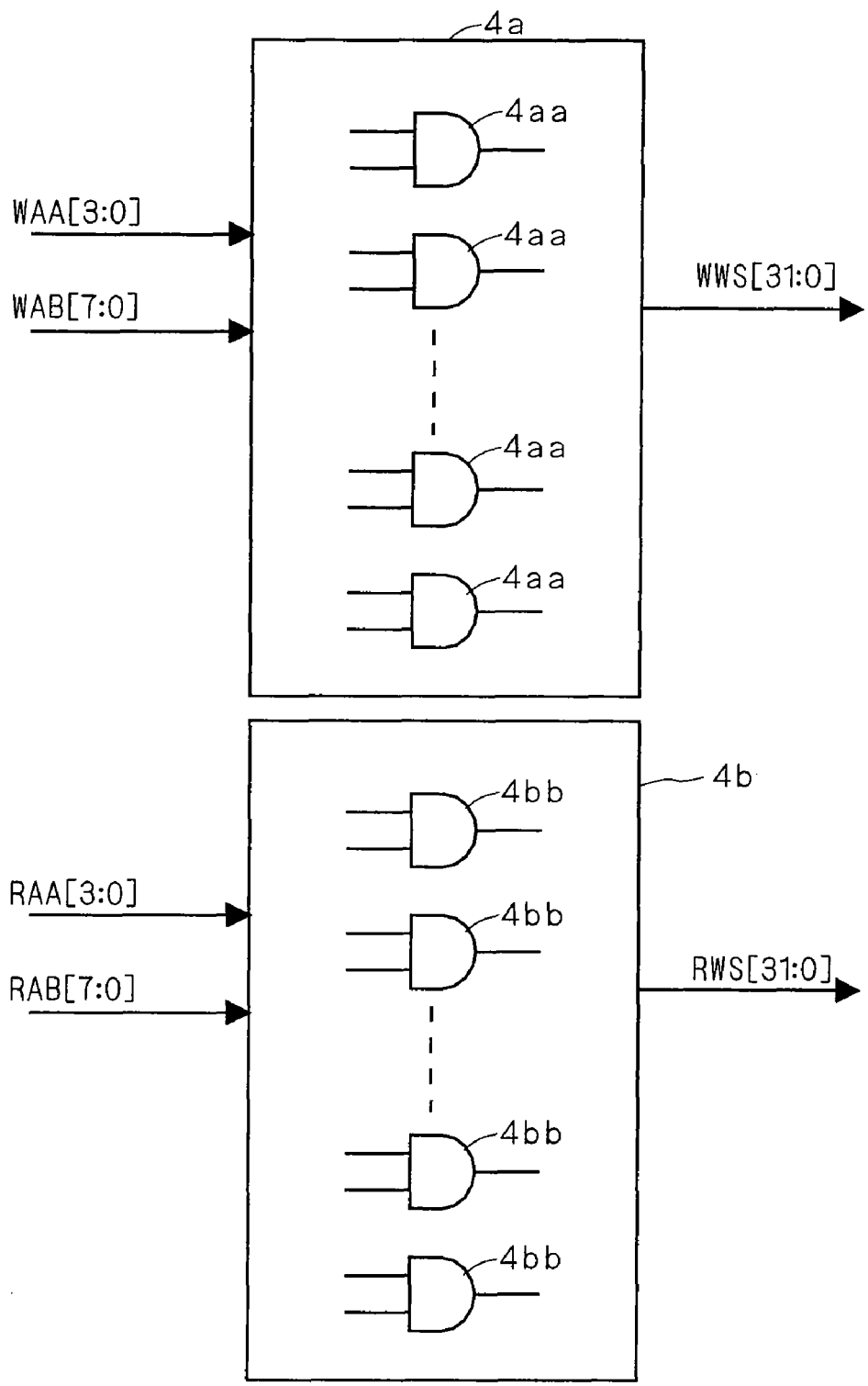
FIG. 4 is a block diagram showing a configuration of a decoder circuit according to the first embodiment of the present invention.

FIG. 4 is a block diagram showing a configuration of the decoder circuit 4. As shown in FIG. 4, the decoder circuit 4 includes a write word line decoder circuit 4*a* which includes 32 AND circuits 4*aa*, and a read word line decoder circuit 4*b* which includes 32 AND circuits 4*bb*. The write word line decoder circuit 4*a* computes conjunctions of the internal write address signal WAA[0] and the internal write address signals WAB[0] to WAB[7], and then outputs the conjunctions respectively as write word line selection signals WWS[0] to WWS[7]. The write word line decoder circuit 4*a* also computes conjunctions of the internal write address signal WAA[1] and the internal write address signals WAB[0] to WAB[7], and then outputs the conjunctions respectively as write word line selection signals WWS[8] to WWS[15]. The write word line decoder circuit 4*a* also computes conjunctions of the internal write address signal WAA[2] and the internal write address signals WAB[0] to WAB[7], and then outputs the conjunctions respectively as write word line selection signals WWS[16] to WWS[23]. The write word line decoder circuit 4*a* also computes conjunctions of the internal write address signal WAA[3] and the internal write address signals WAB[0] to WAB[7], and then outputs the conjunctions respectively as write word line selection signals WWS[24] to WWS[31]. It should be noted that a 32-bit write word line selection signal WWS[31:0] is outputted from each of the 32 AND circuits 4*aa* within the write word line decoder circuit 4*a*.

In the same manner as above, the read word line decoder circuit 4*b* computes conjunctions of the internal read address signal RAA[0] and the internal read address signals RAB[0] to RAB[7], and then outputs the conjunctions respectively as read word line selection signals RWS[0] to RWS[7]. The read word line decoder circuit 4*b* also computes conjunctions of the internal read address signal RAA[1] and the internal read address signals RAB[0] to RAB[7], and then outputs the conjunctions respectively as read word line selection signals RWS[8] to RWS[15]. The read word line decoder circuit 4*b* also computes conjunctions of the internal read address signal RAA[2] and the internal read address signals RAB[0] to RAB[7], and then outputs the conjunctions respectively as read word line selection signals RWS[16] to RWS[23]. The read word line decoder circuit 4b also computes conjunctions of the internal read address signal RAA[3] and the internal read address signals RAB[0] to RAB[7], and then outputs the conjunctions respectively as read word line selection signals RWS[24] to RWS[31]. It should be noted that a 32-bit read word line selection signal RWS[31:0] is outputted from each of the 32 AND circuits 4bb within the read word line decoder circuit 4b.

Figure 5:
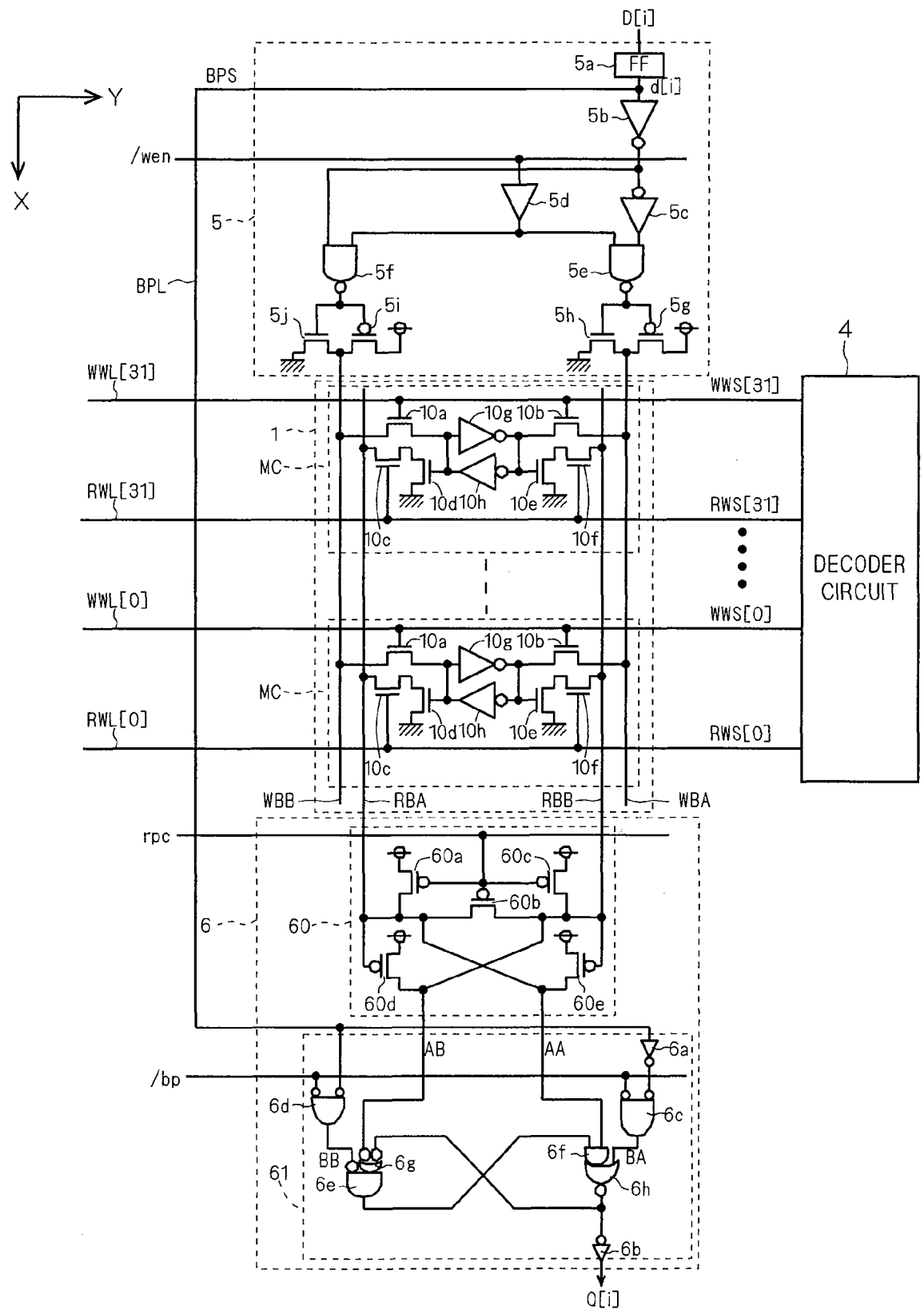
FIG. 5 is a view showing a circuit configuration and a layout structure in plan view of a memory cell array, an input buffer circuit and an output buffer circuit according to the first embodiment of the present invention.

FIG. 5 is a view showing a circuit configuration and a layout structure in plan view of the memory cell array 1, the input buffer circuit 5 and the output buffer circuit 6 in one group. It is to be noted that the same circuit configuration and layout structure applies to every group including the memory cell array 1, the input buffer circuit 5 and the output buffer circuit 6.

The input buffer circuit 5 receives input data D[i] inputted into the input port INi, and outputs the input data D[i] to the memory cell array 1 based upon the inversion write control signal /wen outputted from the write control circuit 2. As shown in FIG. 5, the input buffer circuit 5 includes a flip flop circuit 5a, inverter circuits 5b, 5c, a buffer circuits 5d, NAND circuits 5e, 5f, PMOS transistors 5g, 5i, and NMOS transistors 5h, 5j.

The input data D[i] is inputted into a D input terminal of the flip flop circuit 5a, and Q output of the flip flop circuit 5a is inputted into the inverter circuit 5b as data d[i]. Further, a Q output terminal of the flip flop circuit 5a is connected to one end of a bypass line BPL extending from the input buffer circuit 5 to the output buffer circuit 6. Data d[i] is transmitted as a bypass signal BPS to the output buffer circuit 6 through the bypass line BPL. It should be noted that output of the inverter circuit 2b in the write control circuit 2 is inputted into a CLK input terminal of the flip flop circuit 5a.

The inverter circuit 5b inverts the data d[i], and outputs the inverted signal. The inverter circuit 5c inverts the output of the inverter circuit 5b, and outputs the inverted signal. The buffer circuit 5d outputs the inversion write control signal /wen outputted from the write control circuit 2 with its logic level remained. The NAND circuit 5e computes a non-conjunction of the output of the inverter circuit 5c and the output of the buffer circuit 5d, and then outputs the non-conjunction. The NAND circuit 5f computes a non-conjunction of the output of the inverter circuit 5b and the output of the buffer circuit 5d, and then outputs the non-conjunction.

A power potential is applied to each of source terminals of PMOS transistors 5g, 5i. A ground potential is applied to each of source terminals of NMOS transistors 5h, 5j. A drain terminal of the PMOS transistor 5g and a drain terminal of the NMOS transistor 5h are connected to each other, and one end of a write bit line WBA extending from the input buffer circuit 5 to the memory cell array 1 is connected to each of the drain terminals. Meanwhile, a drain terminal of the transistor 5i and a drain terminal of the NMOS transistor 5j are connected to each other, and one end of a write bit line WBA extending from the input buffer circuit 5 to the memory cell array 1 is connected to each of the drain terminals. The output of the NAND circuit 5e is inputted into each of gate terminals of the PMOS transistor 5g and the NMOS transistor 5h, and the output of the NAND circuit 5f is inputted into each of gate terminals of the PMOS transistor 5i and the NMOS transistor 5j.

In this example, one memory cell array 1 includes 32 memory cells MC. In the layout structure in plan view, those 32 memory cells MC are arranged in a row along a direction perpendicular to the arranging direction of the n memory cell arrays 1, namely the X-axis direction in FIG. 1. In the whole of the n memory arrays 1, (32×n) memory cells MC are arranged in a matrix of 32 columns in the X-axis direction and n rows in the Y-axis direction.

Each of the memory cells MC includes NMOS transistors 10a to 10f and inverter circuits 10g, 10h. A drain terminal of the NMOS transistor 10a is connected to the write bit line WBB, and a source terminal of the NMOS transistor 10a is connected to an input terminal of the inverter circuit 10g, an output terminal of the inverter circuit 10h and a gate terminal of the NMOS transistor 10d. A drain terminal of the NMOS transistor 10b is connected to the write bit line WBA, and a source terminal of the NMOS transistor 10b is connected to an output terminal of the inverter circuit 10g, an input terminal of the inverter circuit 10h, an output terminal of the inverter circuit 10g and a gate terminal of the NMOS transistor 10e. A drain terminal of the NMOS transistor 10c is connected to a read bit line RBA extending from the memory cell array 1 to the output buffer circuit 6, and a source terminal of the NMOS transistor 10c is connected to a drain terminal of the NMOS transistor 10d. A drain terminal of the NMOS transistor 10f is connected to a read bit line RBB extending from the memory cell array 1 to the output buffer circuit 6, and a source terminal of the NMOS transistor 10f is connected to a drain terminal of the NMOS transistor 10e. A ground potential is applied to each of source terminals of NMOS transistors 10d, 10e.

32 write word lines WWL[31:0] are respectively connected to gate terminals of the NMOS transistor 10a, 10b in the 32 memory cells MC of the memory cell array 1. Write word line selection signals WWS[0] to WWS[31] which are outputted from the decoder circuit 4 are respectively given to the write word lines WWL[0] to WWL[31], and any one of those is activated when data in the memory cell array 1 is written.

Further, 32 read word lines RWL[31:0] are respectively connected to gate terminals of the NMOS transistor 10c, 10f in the 32 memory cells MC of the memory cell array 1. Read word line selection signals RWS[0] to RWS[31] which are outputted from the decoder circuit 4 are respectively given to the read word lines RWL[0] to RWL[31], and any one of those is activated when data in the memory cell array 1 is read. Assuming that j is an arbitrary integer satisfying ($0 \leq j \leq n$), a write word line WWL[j] is paired with a read word line RWL[j], and those word lines are connected to the same memory cell MC.

The output buffer circuit 6 outputs the received data as output data Q[i] to the output port OUTi based upon the internal read control signal rpc and the inversion bypass control signal /bp which are outputted from the read control circuit 3. As shown in FIG. 5, the output buffer circuit 6 includes: a sense amplifier circuit 60 for amplifying data transmitted through the bit line RBA, RBB and outputting the amplified data; and an output selection circuit 61 for outputting either the data outputted from the sense amplifier circuit 60 or the bypass signal BPS to the output port OUTi.

The sense amplifier circuit 60 includes five PMOS transistors 60a to 60e. A power potential is applied to each of source terminals of the PMOS transistors 60a, 60c, 60d, 60e. The internal read control signal rpc is inputted into each of gate terminals of the PMOS transistors 60a to 60c. Drain terminals of the PMOS transistors 60a, 60b, 60e and a gate terminal of the PMOS transistor 60d are connected to the read bit line RBA. A signal at each of such connection points is outputted from the sense amplifier circuit 60. Drain terminals of the PMOS transistors 60c, 60d and a source terminal of the PMOS transistor 60e are connected to the read bit line RBB, and a signal at each of such connection points is outputted as an output signal AB from the sense amplifier circuit 60.

The output selection circuit 61 includes inverter circuits 6a, 6b, AND circuits 6c to 6f, an OR circuit 6g, and a NOR circuit 6h. An input terminal of the inverter circuit 6a is connected to the bypass line BPL, and inverts the bypass signal BPS transmitted through the bypass signal BPL and outputs the inverted signal. The AND circuit 6c computes a conjunction of the inversion signal outputted from the inverter circuit 6a and an inversion signal of the inversion bypass control signal /bp, and then outputs the conjunction as a signal BA. The AND circuit 6f computes a conjunction of the output of the AND circuit 6e and an output signal AA from the sense amplifier circuit 60, and then outputs the conjunction. The NOR circuit 6h computes a non-conjunction of the signal BA and the output of the AND circuit 6f, and outputs the non-conjunction. The inverter circuit 6b inverts the output of the NOR circuit 6h and outputs the inverted signal as output data Q[i] to the output port OUT[i]. One of input terminals of the AND circuit 6d is connected with the bypass line BPL, and the AND circuit 6d computes a conjunction of the inversion signal of the bypass signal BPS and the inversion signal of the inversion bypass control signal /bp, and then outputs the conjunction as a signal BB. The OR circuit 6g computes a conjunction of an inversion signal of the NOR circuit 6h and an inversion signal of the output signal AB from the sense amplifier circuit 60, and then outputs the conjunction. The AND circuit 6e computes a conjunction of an inversion signal of the signal BB and the output of the OR circuit 6g, and then outputs the conjunction.

In the first embodiment, as shown in FIG. 5, the memory cell array 1, the sense amplifier circuit 60 and the output selection circuit 61 are arranged in this order in a row along the X-axis direction in the layout structure in plan view. With the flow of the data taken into consideration, it is desirable to apply the above-mentioned arrangement order so as to make excess wiring unnecessary. However, the memory cell array 1, the output selection circuit 61 and the sense amplifier circuit 60 may be arranged in this order in a low by reason of layout limitation or the like.

While the decoder circuit 4 is provided to the right of the memory cell array 1 in the layout example shown in FIG. 5, the decoder circuit 4 may be divided to the right side and the left side, and the write word line decoder circuit 4a and the write word line decoder circuit 4b may be provided on the respective sides.

The semiconductor memory device 100 having such a configuration as above mentioned is used, for example, for adjustment of operation timing between two arithmetic circuits having different operating frequencies. An example of such use is described below.

Figure 6:
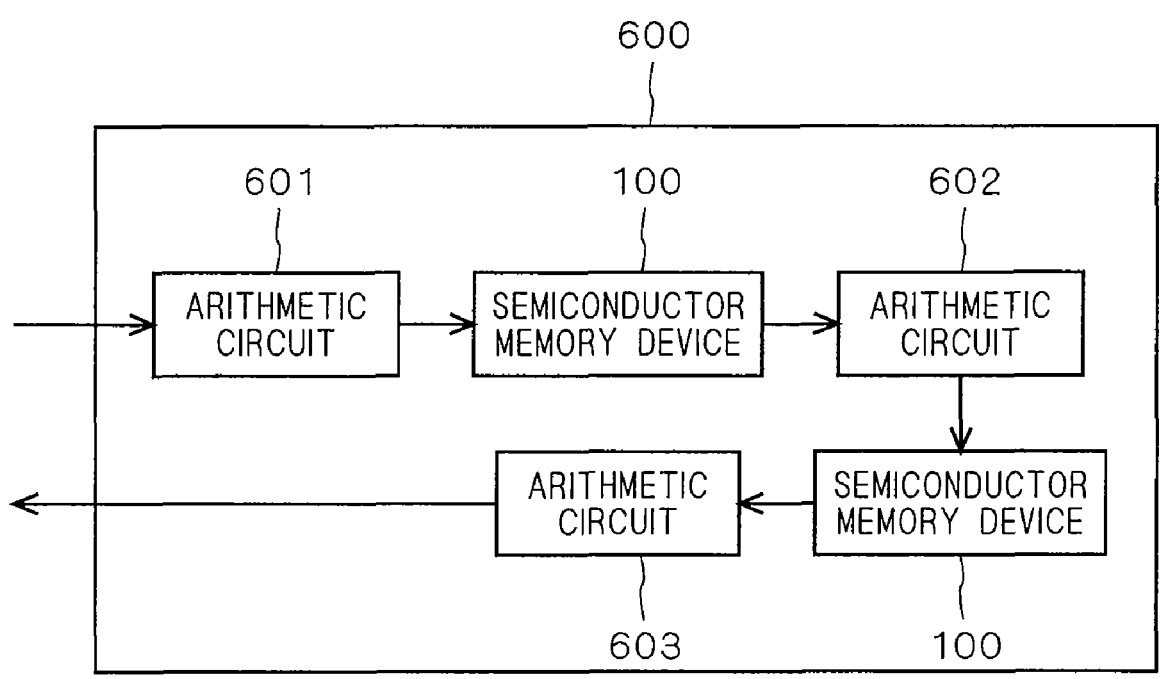
FIG. 6 is a block diagram showing a configuration of a semiconductor device according to the first embodiment of the present invention.

FIG. 6 is a block diagram showing a configuration of a semiconductor device 600 including a plurality of semiconductor memory devices 100 as semiconductor memory section. As shown in FIG. 6, the semiconductor device 600 includes three arithmetic circuits 601 to 603 and two semiconductor memory devices 100. Each of the arithmetic circuits has a different operating frequency. One of the two semiconductor memory device 100 is arranged between the arithmetic circuits 601 and 602, and the other semiconductor memory device 100 is arranged between the arithmetic circuits 602 and 603. The arithmetic circuit 601 performs prescribed arithmetic processing of data inputted from the outside of the 200, and writes the obtained data into the one semiconductor memory device 100. The arithmetic circuit 602 reads data, having been subjected to the arithmetic processing in the arithmetic circuit 601 and written into the semiconductor memory device 100), and perform prescribed arithmetic processing to write the data into the other semiconductor memory device 100. The arithmetic circuit 603 reads data, having been subjected to the arithmetic processing in the arithmetic circuit 602 and written into the semiconductor memory device 100, performs described arithmetic processing on the data, and outputs the data to the outside of the semiconductor device 600.

As thus described, arranging the semiconductor memory device 100 between two arithmetic circuits that have different operating timing and writing output data from the one arithmetic circuit into the semiconductor memory device 100, permits the other arithmetic circuit to read the output data of the one arithmetic circuit from the semiconductor memory device 100 at its own operating timing. It is therefore possible for the other arithmetic circuit to receive output data from the one arithmetic circuit without depending upon operating timing of the one arithmetic circuit.

Next, the operation of the semiconductor memory device 100 according to the first embodiment is described. Generally, the semiconductor memory device 100 briefly has two operation modes: a normal operation mode and a bypass mode. The normal operation mode is composed of a write mode and a read mode. In the write mode, the semiconductor memory device 100 functions as a memory circuit in which data is capable of being wrote, and input data D[n−1:0] having been inputted into the input ports IN0 to INn−1 are written into the memory cell arrays 1. In the read mode, the semiconductor memory device 100 functions as a memory circuit from which data is capable of being read, and data having been read from n memory cell arrays 1 are outputted as output data Q[n−1:0] from the output port OUT0 to OUTn−1. Meanwhile, in the bypass mode, the input data D[n−1:0] is outputted as it is as the output data Q[n−1:0], and data is not read from the memory cell array 1.

First, the normal operation mode is described. When the bypass control signal BP=0, the semiconductor memory device 100 operates in the normal operation mode. In the write mode where the input data D[i] is written, the write control signal WEN and the write cell selection control signal WCEN both become "0". Then, a positive polarity pulse signal is outputted as the inversion write control signal /wen from the write control circuit 2, and by the action of the write control circuit 2 and the decoder circuit 4, any one of the write word line selection signals WWS[31:0] becomes "1" according to a value of the write address signal WA[4:0] to activate any one of the write word line WWL[31:0]. When the inversion write control signal /wen becomes "1", the input data D[i] is transmitted to the memory cell array 1 through the write bit lines WBA, WBB, and the input data D[i] is written into the memory cell MC connected to the activated write word line WWL[j].

In the read mode where data is read from the memory cell array 1, the read cell selection control signal RCEN becomes "0". Then, a positive polarity pulse signal is outputted as the internal read cell selection control signal rpc from the read control circuit 3, and by the action of the read control circuit 3 and the decoder circuit 4, any one of the read word line selection signals RWS[31:0] becomes "1" according to a value of the read address signal RA[4:0] to activate any one of the read word line RWL[31:0]. When the read word line RWL[j] is activated, data is read from the memory cell MC connected thereto, and transmitted to the sense amplifier circuit 60 in the output buffer circuit 6 through the read bit lines RBA, RBB.

When the internal read control signal rpc becomes "1", the data read from the memory cell MC is amplified in the sense amplifier circuit 60. When the bypass control signal BP=0, the internal bypass control signal bp outputted from the write control circuit 2 becomes "0", and the inversion bypass control signal /bp outputted from the read control circuit 3 becomes "1". As a result, the signals BA, BB both become "0". It is thus not possible to accept in the output selection circuit 61 the bypass signal BPS transmitted through the bypass line BPL. From the output selection circuit 61, the data amplified in the sense amplifier circuit 60 and transmitted from the memory cell MC is outputted as the output data Q[i], which is then outputted from the output port OUTi.

Next, the bypass mode is described. When the bypass control signal BP=1, the semiconductor memory device 100 operates in the bypass mode. When the input data D[i] is inputted into the input buffer circuit 5, the bypass line BPL transmits the inputted data input data D[i] as the bypass signal BPS to the output buffer circuit 6. When the bypass control signal BP=1, the internal bypass control signal bp outputted from the write control circuit 2 becomes "1", and the inversion bypass control signal /bp outputted from the read control circuit 3 becomes "0". As a result, the signal BA shows the same logic level as that of the bypass signal BPS, and the signal BB shows the opposite logic level to that of the bypass signal. Therefore, the input data D[i] is outputted as the output data Q[i] from the output selection circuit 61, and the output data Q[i] is outputted from the output port OUTi.

As thus described, in the bypass mode, the input data D[i] is transmitted to the output buffer circuit 6 through the bypass line BPL, and the input data D[i] is outputted as the output data Q[i] from the output buffer circuit 6. Accordingly, as the aforesaid arithmetic circuits 602, 603 shown in the FIG. 6, in testing the arithmetic circuit connected to the output ports OUT0 to OUTn−1 of the semiconductor memory device 100, it is not necessary to write test data into the memory cell array 1 and then read the test data from the memory cell array 1, but it is possible to give test data, having been inputted into the input ports IN0 to INn−1, directly to an arithmetic circuit to be tested This consequently facilitates performance of testing of the circuit to be tested.

As thus described, in the semiconductor memory device 100 according to the first embodiment, the input data D[i] is transmitted to the output buffer circuit 6 by arrangement of the bypass line BPL intended for the purpose. Hence, how to arrange this bypass line BPL in the layout is a matter of concern. In the first embodiment, the bypass line BPL is arranged so as to pass through between memory arrays 1.

Figure 7:
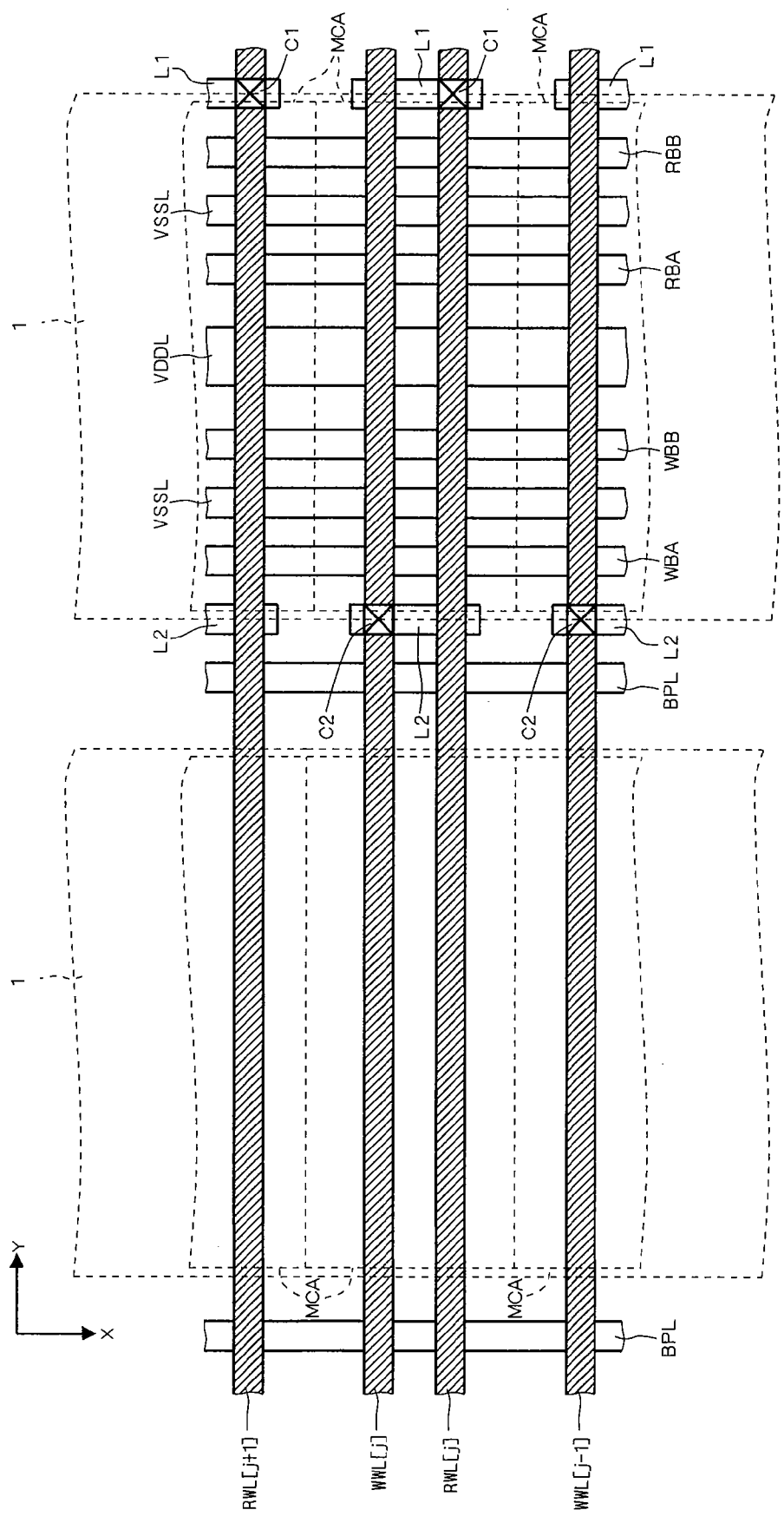
FIG. 7 is a plan view showing a layout structure of the semiconductor memory device according to the first embodiment of the present invention.

FIG. 7 is a plan view showing a layout structure of the two adjacent memory cell arrays 1. FIG. 7 primarily shows a layout pattern relative to the present invention for avoiding complexity of the figure. Further, a region MCA in FIG. 7 shows a region in which one memory cell MC is formed, as well as a region where a transistor activation region and a gate electrode which constitute the memory cell MC are arranged. Hereinafter, the region MCA is referred to as a "memory cell formation region MCA". It is to be noted that since all the memory cells 1 are in common in terms of the layout pattern within the region where each of the memory cell arrays 1 is formed, in FIG. 7, the read word line RWL[j], RWL[j+1] and the write word line WWL[j−1], WWL[j] alone are shown in the layout pattern within the region where the left-side memory array 1 is formed, and other lines are omitted.

The semiconductor memory device 100 has a plurality of mutually stacked wiring layers. As shown in FIG. 7, the write bit lines WBA, WBB, the read bit lines RBA, RBB, the bypass line BPL, the power wiring VDDL and the ground wiring VSSL are arranged in the same wiring layer among the wiring layers, and each extend along the X-axis direction. Further, in each of the memory cell arrays 1, the write bit lines WBA, WBB, the read bit lines RBA, RBB, the bypass line BPL, the power wiring VDDL and the ground wiring VSSL are arranged on each of the memory cell formation regions MCA. It should be noted that the power wiring VDDL and the ground wiring VSSL are wiring which respectively provide a power potential and a ground potential to a transistor within the memory cell array 1.

Meanwhile, the write word line WWL[31:0] and the read word line RWL[31:0] extend along the Y-axis direction, and arranged in the same wiring layer above the wiring layer in which the write bit lines, WBA, WBB and the like are arranged. Hereinafter, the wiring layer in which the word bit lines WBA, WBB and the like are arranged is referred to as a "lower wiring layer", while the wiring layer in which the write word line WWL[31:0] and the like are arranged is referred to as an "upper wiring layer".

In the lower wiring layer, there are further provided wiring L1 for electrically connecting the memory cell MC and the read word line RWL[j], and wiring L2 for electrically connecting the memory cell MC and the write word line WWL[j]. The wiring L1 and the read word line RWL[j] are connected at a contact C1, and the wiring L2 and the write word line WWL[j] are connected at a contact C2.

Moreover, in the lower wiring layer, two sets of ground wiring VSSL are arranged in each of the memory cell arrays 1. The wiring L2, the write bit line WBA, the one set of ground wiring VSSL, the write bit line WBB, the power wiring VDDL, the read bit line RBA, the other set of ground wiring VSSL, the read bit line RBB and the wring L1 are arranged in this order along the Y-axis direction in each of the memory cell arrays 1. As shown in FIG. 7, in the layout structure in plan view, the bypass line BPL extending from the input buffer circuit 5 to the output buffer circuit 6 in some group is arranged through the memory cell array 1 belonging to the group and the memory cell array 1 adjacent thereto. In the first embodiment, the bypass line BPL, the wiring L2 and the write bit line WBA are arranged in this order along the Y-axis direction. It is to be noted that, since n memory cell arrays 1 are arranged in a row along the Y-axis direction as described above, the bypass line BPL corresponding to the memory cell array 1 in the lowest position in FIG. 1 is not passing through the memory cell arrays 1.

As thus described, in the layout structure in plan view, arrangement of the bypass line BPL through the adjacent two memory cell arrays 1 enables wiring of the bypass line BPL without effects of the layout structure within the region where the memory cell arrays 1 are arranged. This can lead to simplification of the layout structure, enabling size reduction of the device as well as simplification of the device production process. It is further possible to reduce effects exerted on the bypass signal BPS, which is transmitted to the output buffer circuit 6 through the bypass line BPL, by the read bit lines RBA, RBB within the region where the memory cell array 1 is formed.

Further, a case is described where the write bit lines WBA, WBB extending from the input buffer circuit 5 to the memory cell array 1, the read bit lines RBA, RBB extending from the memory cell array 1 to the output buffer circuit 6, and the bypass line BPL extending from the input buffer circuit 5 to the output buffer circuit 6 are arranged in the layout structure where the memory cell array 1 is sandwiched between the input buffer circuit 5 and the output buffer circuit 6. In this case, with those sets of wiring arranged in the same wiring layer, it is possible to extend all the sets of wiring in the same direction (x-axis direction in FIG. 6) as shown in FIG. 7, so as to simplify the shape of the layout pattern of those sets of wiring. It is therefore possible to simplify the layout structure, so as to reduce the device in size and simplify the device production process.

It should be noted that, while the bypass line BPL, the wiring L2 and the write bypass line WBA were arranged in this order in the first embodiment, the read bit line RBB, the wiring L1, the bypass line BPL may be arranged in this order in the Y-axis direction, and the bypass line BPL may be arranged between the memory cell arrays 1.

Figure 8:
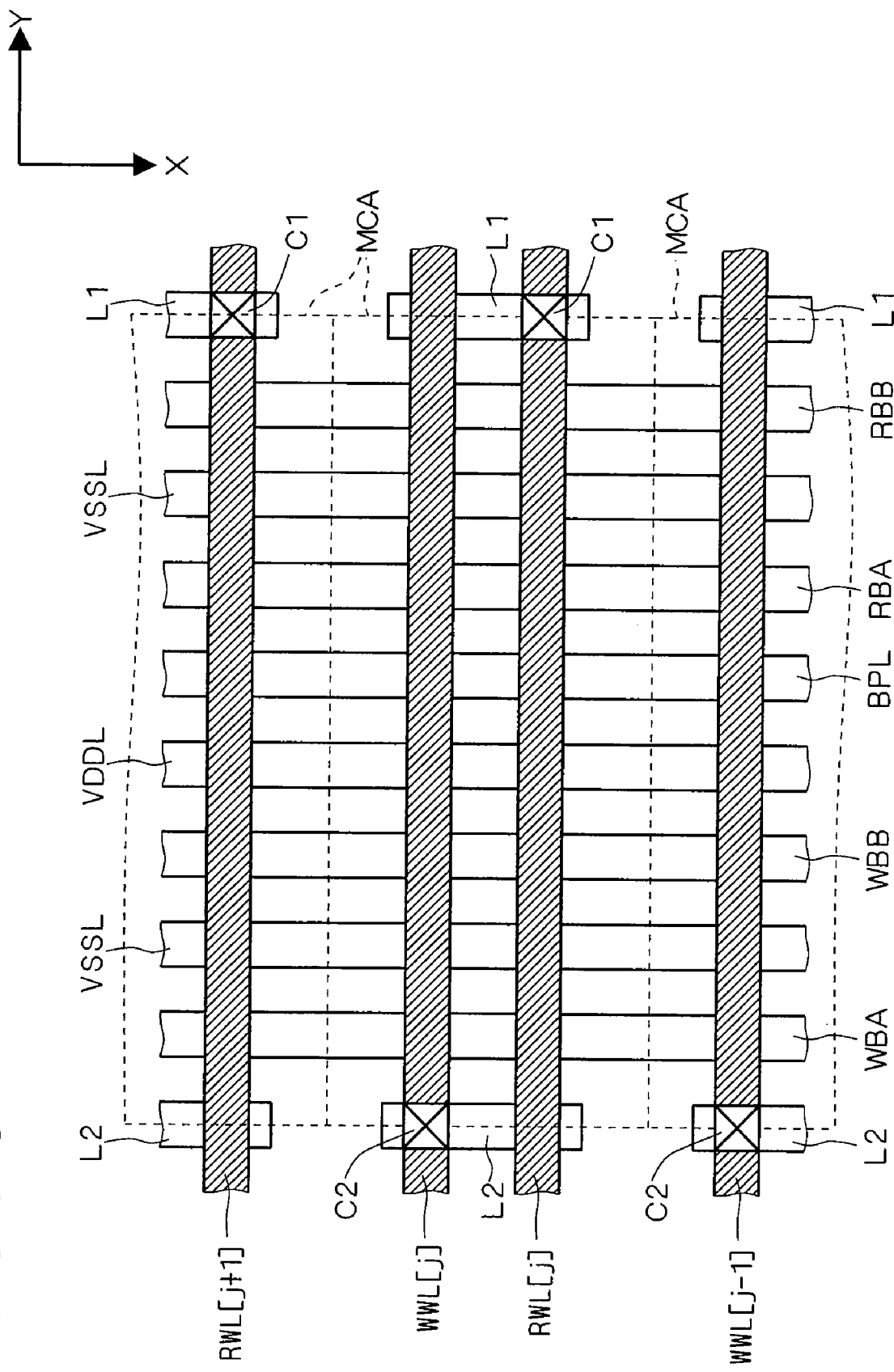
FIG. 8 is a plan view showing a modified example of the layout structure of the semiconductor memory device according to the first embodiment of the present invention.

Further, as shown in FIG. 8, in the layout structure shown in FIG. 7, the pattern width of the power wiring VDDL may be made narrower than the original pattern width shown in FIG. 7, and the bypass line BPL may be arranged between the power wiring VDDL and the read bit line RBA, so that the bypass line BPL may be arranged so as to pass through each of the memory cell formation regions MCA in the layout structure in plan view. As thus described, in the layout structure where the memory cell array 1 is sandwiched between the input buffer circuit 5 and the output buffer circuit 6, arrangement of the bypass line BPL, the wiring bit lines WBA, WBB, the read bit lines RBA, RBB, the power wiring VDDL and the ground wiring VSSL on each of the memory cell formation regions MCA allows simplification of the layout structure, leading to size reduction of the device as well as simplification of the device production process.

Figure 9:
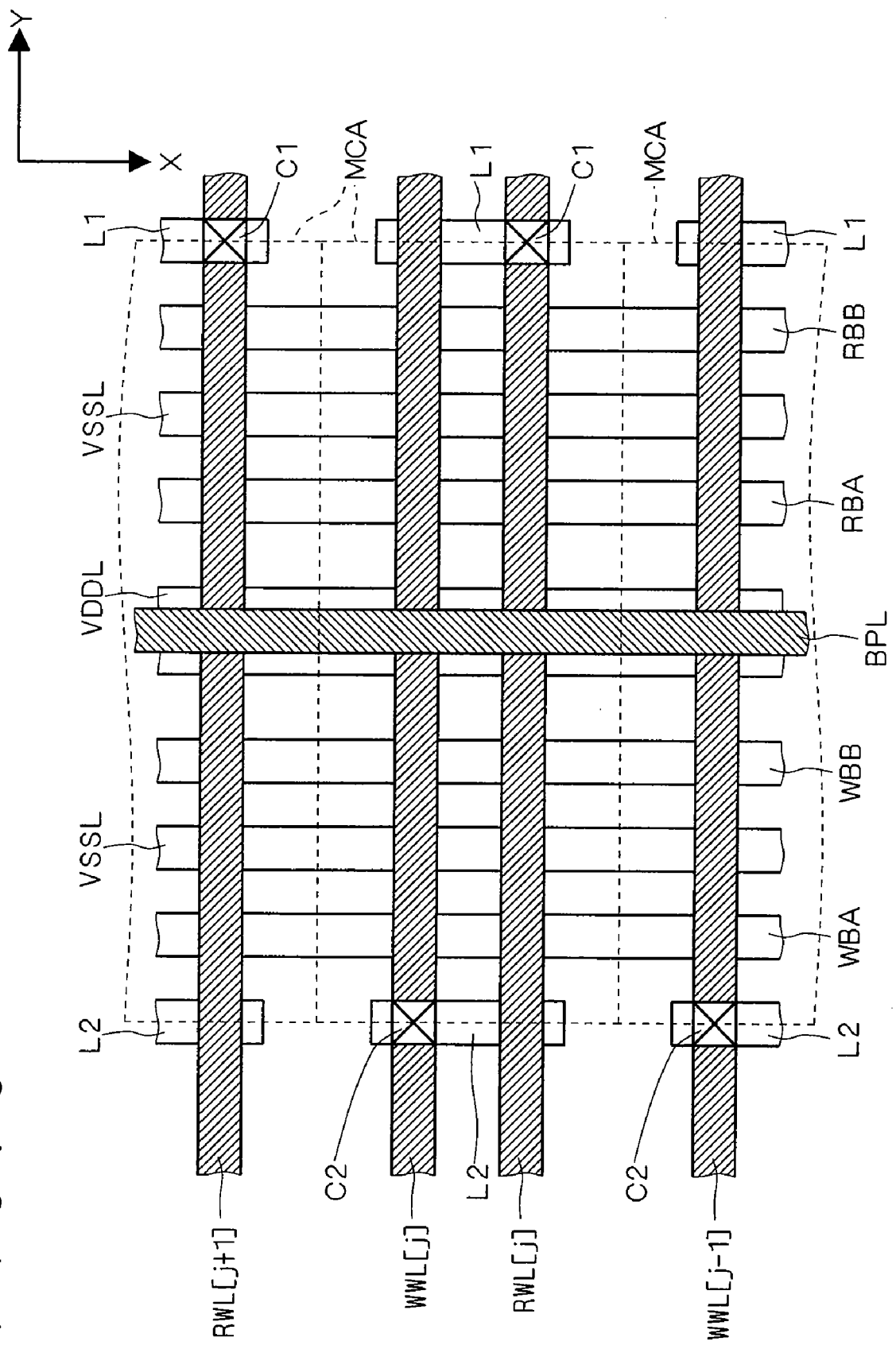
FIG. 9 is a plan view showing a modified example of the layout structure of the semiconductor memory device according to the first embodiment of the present invention.

Moreover, as shown in FIG. 9, in the layout structure shown in FIG. 7, the bypass line BPL may be arranged in the wiring layer above the wiring layer in which the write word line WWL[31:0] and the like are arranged, and the bypass line BPL may also be arranged on each of the memory formation regions MCA in the layout structure in plan view. By arrangement of the bypass line BPL in a wiring layer different from a wiring layer in which the write word lines WWL[31:0] and the like and also on each of the memory cell formation regions MCA in the layout structure in plan view as described above, it is possible to make the layout area smaller as compared with the layout structure shown in FIG. 7. Further, in contrast to the layout structure shown in FIG. 8, the bypass line BPL can be arranged without reducing the pattern width of the power wiring VDDL, thereby enabling flexible arrangement of the bypass line BPL.

In addition, as shown in FIG. 9, the bypass line BPL is preferably arranged so as to overlap with the power wiring VDDL in the layout structure in plan view. It is thereby possible to make the potential of the bypass line BPL resistant to noise from the outside so as to suppress fluctuation of the signal level of the bypass line BPL. It is further possible to make noise, generated due to the operation of the bypass line BPL, have less effect on the write bypass lines WBA, WBB and the read bypass lines RBA, RBB in the lower layer.

In the layout example of FIG. 9, the wiring width of the power wiring VDDL is made larger than that of the ground wiring VSSL since two sets of ground wirings VSSL and one set of power wiring VDDL are arranged in the memory cell formation region MCA. However, one set of ground wiring VSSL and two sets of power wiring VDDL may be arranged in the memory cell formation region MCA, and in this case, the wiring width of the ground wiring VSSL is made larger than that of the power wiring VDDL. With such arrangement, the bypass line BPL may be arranged so as to overlap with the ground wiring VSSL in the layout structure in plan view. The same effect as above is generated even in this case. Further, the bypass line BPL may be arranged in a wiring layer below the power wiring VDDL and the ground wiring VSSL.

Second Embodiment

Figure 10:
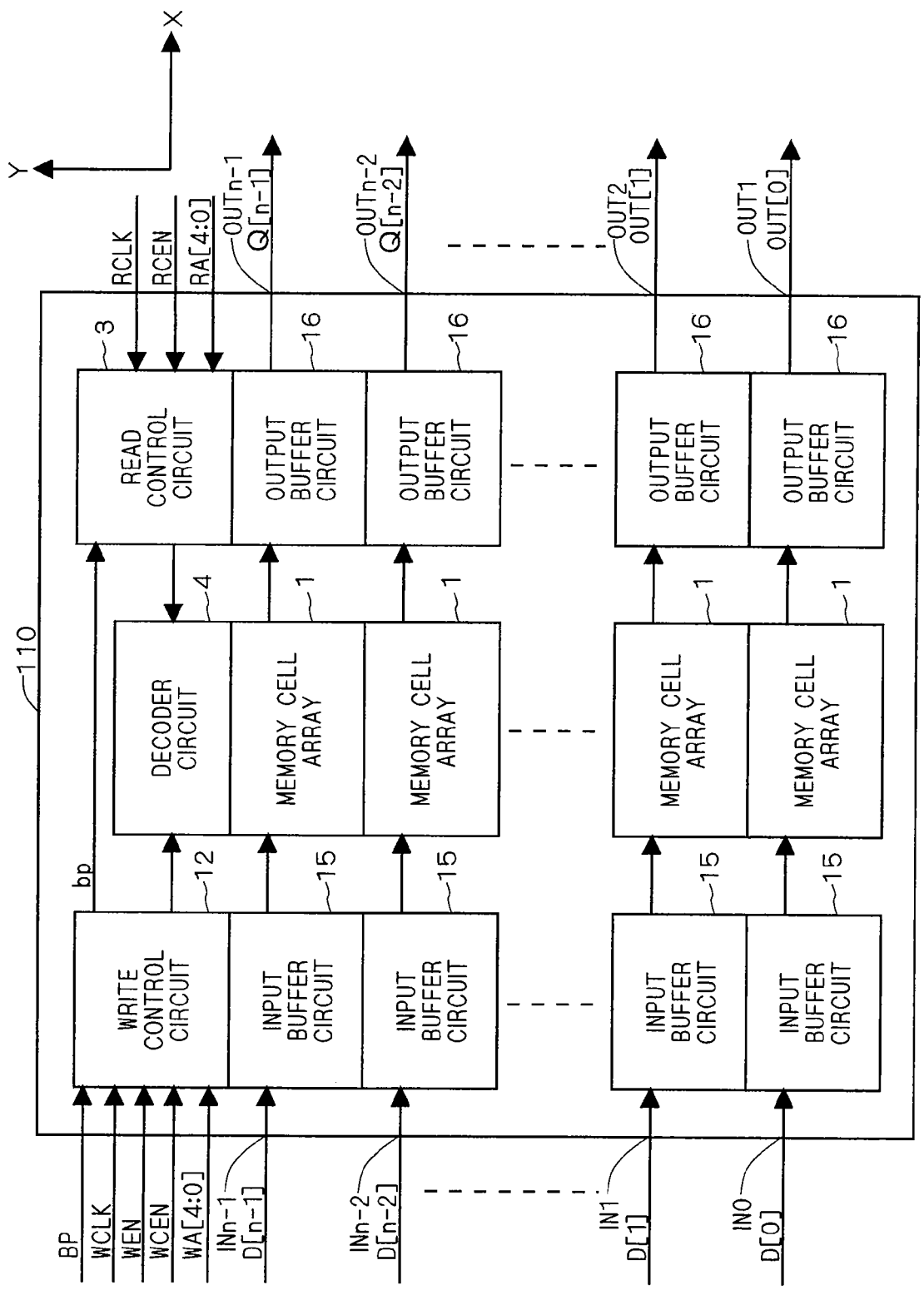
FIG. 10 is a plan view showing a layout structure of a semiconductor memory device according to a second embodiment of the present invention.

FIG. 10 is a plan view schematically showing a layout structure of the semiconductor memory device 10 according to a second embodiment. The semiconductor memory device 110 according to the second embodiment is a device that can realize the bypass function without arrangement of the bypass line BPL for intended for the purpose by arranging, in the aforesaid semiconductor memory device 100 of the first embodiment, a write control circuit 12 in place of the write control circuit 2, n input buffer circuits 15 in place of the n input buffer circuits 5, and n output buffer circuits 16 in place of the output buffer circuits 6. As in the first embodiment, one input buffer circuit 15, one output buffer circuit 16 and one memory cell array 1 constitute one group. The layout of the write control circuit 12, the input buffer circuit 15 and the output buffer circuit 16 is the same as the layout of the write control circuit 2, the input buffer circuit 5 and the output buffer circuit 6 according to the first embodiment.

Figure 11:
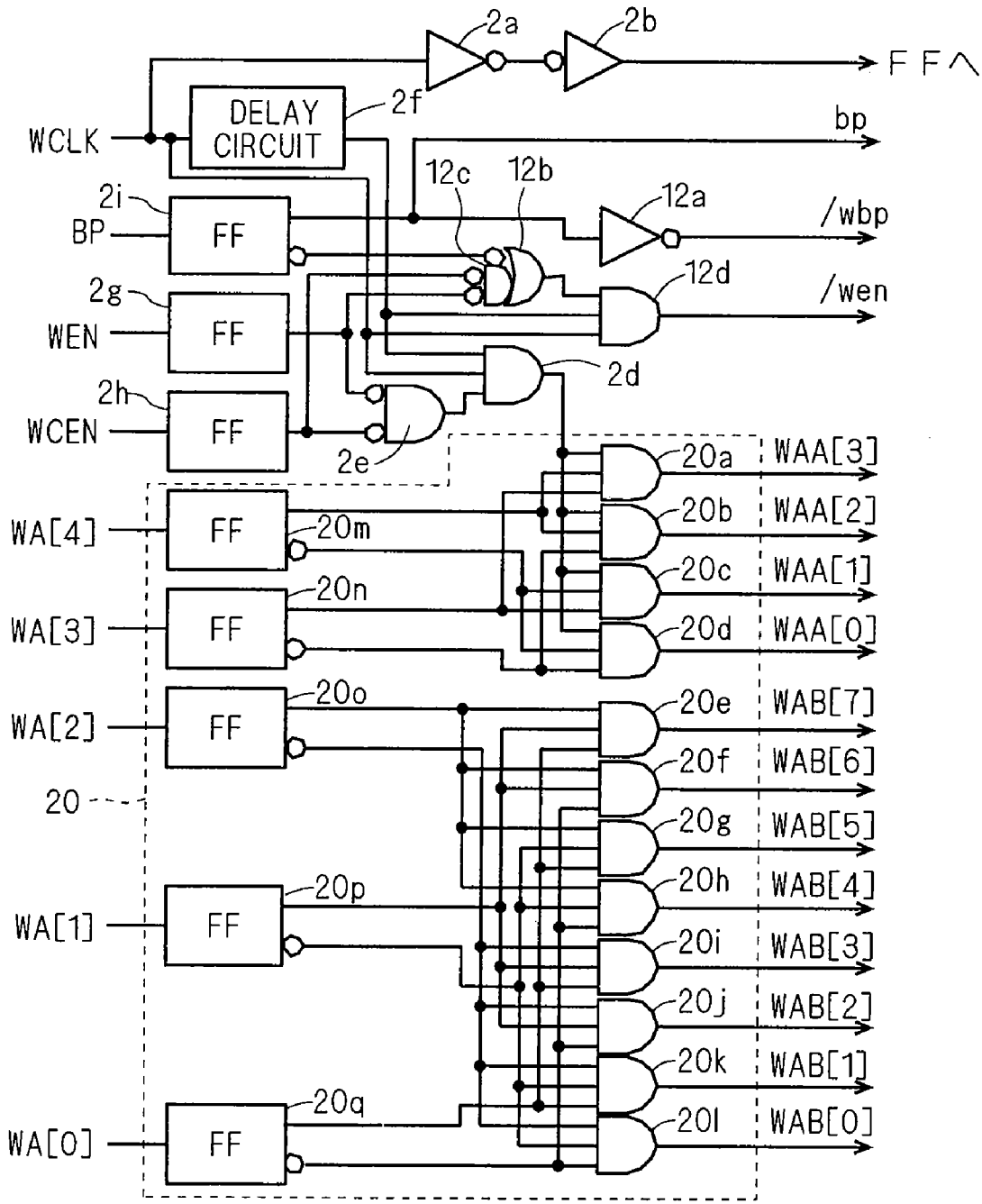
FIG. 11 is a view showing a circuit configuration of a write control circuit according to the second embodiment of the present invention.

FIG. 11 shows a circuit configuration of the write control circuit 12. As shown in FIG. 11, the write control circuit 12 is a circuit formed by further arranging an inverter circuit 12a and also arranging an OR circuit 12b and AND circuits 12c, 12d in place of the buffer circuit 2c in the aforesaid write control circuit 2. The invert circuit 12a inverts the internal bypass control signal bp outputted from a flip flop circuit 2i and outputs the inverted signal as an inversion bypass control signal /wbp. The AND circuit 12c computes a conjunction of inversion signals of Q output of the flip flop circuits 2g, 2h, and then outputs the conjunction. The AND circuit 12b computes a figuration of an inversion signal of Q-bar output of the flip flop circuit 2i and the output of the AND circuit 12c, and then outputs the conjunction. The AND circuit 12d computes a conjunction of the output of the OR circuit 12b, output of a delay circuit 2f, and a write clock signal WCLK, and then outputs the conjunction as an inversion write control signal /wen. While the output of the buffer circuit 2c was the inversion write control signal /wen in the first embodiment, the output of the AND circuit 12d is the inversion write control signal /wen in the second embodiment. Since other configurations of the write control circuit 12 are the same as those of the write control circuit 2, descriptions of those configurations are omitted.

Figure 12:
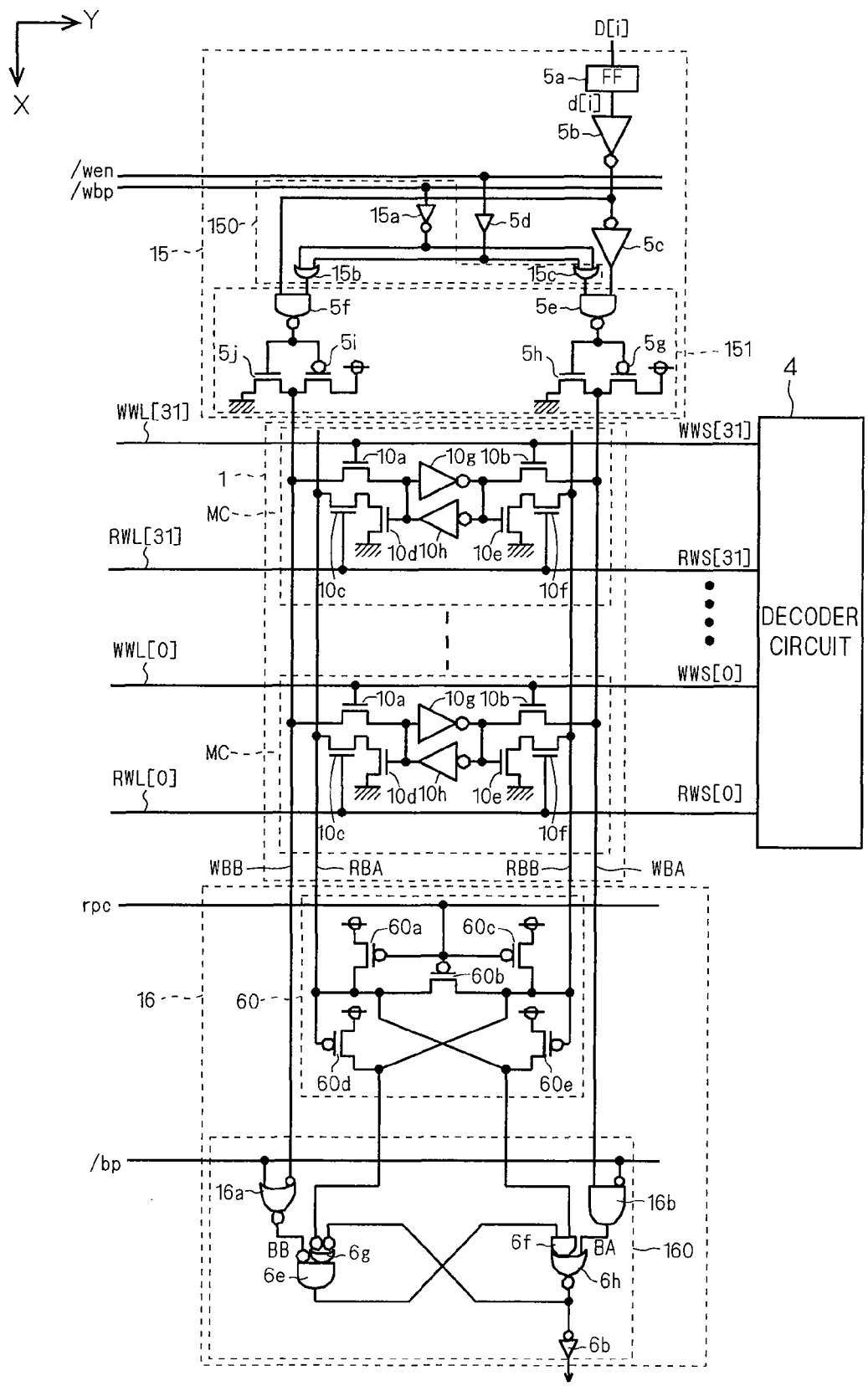
FIG. 12 is a view showing a circuit configuration and a layout structure in plan view of a memory cell array, an input buffer circuit and an output buffer circuit according to the second embodiment of the present invention.

FIG. 12 is a view showing a circuit configuration and a layout structure in plan view of the memory cell array 1, the input buffer circuit 15 and the output buffer circuit 16. The input buffer circuit 15 is a circuit formed by further arranging a data switch circuit 150 that includes an inverter circuit 15a and OR circuits 15b and 15c in the aforesaid input buffer circuit 5.

The data switch circuit 150 outputs input data D[i] based upon the inversion write control signal /wen in the write mode and then outputs the input data D[i] regardless of the inversion write control signal /wen in the bypass mode. The inverter circuit 15a in the data switch circuit 150 inverts the inversion bypass control signal /wbp outputted from the write control circuit 12 and outputs the inverted signal. Each of the OR circuits 15b, 15c computes a conjunction of the output of the inverter circuit 15a and the output of the buffer circuit 5d, and then outputs the conjunction.

In contrast to the first embodiment, the NAND circuit 5f according to the second embodiment computes a non-conjunction of the output of the OR circuit 15b and the output of the inverter circuit 5b, and then outputs the non-conjunction. Further, the NAND circuit 5e computes a non-conjunction of the output of the OR circuit 15c and the output of the inverter circuit 5c, and then outputs the non-conjunction. The NAND circuits 5e, 5f, the PMOS transistors 5g, 5i, and the NMOS transistors 5h, 5j constitute a bit line driver circuit 151 which receives data outputted from the data switch circuit 150 and outputs the data to the write bit lines WBA, WBB. Since the other configurations of the input buffer circuit 15 are the same as those of the input buffer circuit 5, descriptions of those configurations are omitted.

In contrast to the first embodiment, the write bypass lines WBA, WBB according to the second embodiment are extended from the memory cell array 1 to the output buffer circuit 16, and connected respectively to later-described AND circuit 16b and NOR circuit 16a within the output buffer circuit 16.

The output buffer circuit 16 is a circuit formed by arranging, in the aforesaid output buffer circuit 6, an AND circuit 16b in place of the inverter circuit 6a and the AND circuit 6c, and a NOR circuit 16a in place of the AND circuit 6d. The AND circuit 16b computes a conjunction of a signal transmitted through the write bit line WBA and an inversion bypass control signal /bp outputted from the read control circuit 3, and then outputs the conjunction as a signal BA. The NOR circuit 16a computes a non-conjunction of an inversion signal of a signal transmitted through the write bit line WBB and the inversion bypass control signal /bp outputted from the read control circuit 3, and then outputs the non-conjunction as a signal BB.

In the output buffer circuit 16 in the second embodiment, the inverter circuit 6b, the AND circuits 6e, 6f, 16b, the OR circuit 6g, and the NOR circuits 6h, 16a constitute an output selection circuit 160. The output selection circuit 160 outputs data outputted from the sense amplifier circuit 60 to the output port OUTi in the read mode, and outputs data transmitted through the write bit lines WBA, WBB to the output port OUTi in the bypass mode. Since other configurations of the output buffer circuit 16 are the same as those of the output buffer circuit 6, descriptions of those configurations are omitted.

In the second embodiment, as shown in FIG. 12, the data switch circuit 150, the bit line driver circuit 151, the memory cell array 1 and the sense amplifier circuit 60 are arranged in this order in a row along the X-axis direction in the layout structure in plan view. With the flow of the data taken into consideration, it is desirable to apply the above-mentioned arrangement order so as to make excess wiring unnecessary. However, when the arrangement cannot be made in this order by reason of layout limitation or the like, the arrangement may be made in another order.

Next, the operation of the semiconductor memory device 110 according to the second embodiment is described. As in the first embodiment, the semiconductor memory device 110 operates in the normal operation mode when the bypass control signal BP=0. The inversion bypass control signal /wbp outputted from the write control circuit 12 becomes "1" when the bypass control signal BP=0. Then, the output of the inverter circuit 15a becomes "0" in the data switch circuit 150 of the input buffer circuit 15.

Meanwhile, in the write mode where the input data D[i] is written into the memory cell array 1, the write control signal WEN and the write cell selection control signal WCEN both become "0". Then, a positive polarity pulse signal is outputted as the inversion write control signal /wen from the write control circuit 12, and by the action of the write control circuit 12 and the decoder circuit 4, any one of the write word line selection signals WWS[31:0] becomes "1" according to a value of the write address signal WA[4:0] to activate any one of the write word line WWL[31:0]. When the inversion write control signal /wen becomes "1" with the output of the inverter circuit 15a being "0", the input data D[i] is outputted from the data switch circuit 150, and the input data D[i] is written into the memory cell MC connected to the activated write word line WWL[j].

In the read mode where data is read from the memory cell array 1, as in the first embodiment, the read cell selection control signal RCEN becomes "0". Then, a positive polarity pulse signal is outputted as the internal read cell selection control signal rpc from the read control circuit 3, and any one of the read word line selection lines RWL[31:0] is activated. When the read word line RWL[j] is activated, data is read from the memory cell MC connected thereto, and transmitted to the sense amplifier circuit 60 in the output buffer circuit 16 through the read bit lines RBA, RBB.

When the internal read control signal rpc becomes "1", the data read from the memory cell MC is amplified in the sense amplifier circuit 60. When the bypass control signal BP=0, as in the first embodiment, the inversion bypass control signal /bp outputted from the read control circuit 3 becomes "1", and the signals BA, BB both become "0". Therefore, the data read from the memory cell MC and amplified in the sense amplifier circuit 60 is outputted as output data Q[i] from the output selection circuit 160, and the output data Q[i] is then outputted from the output port OUTi.

Next, the bypass mode is described. As in the first embodiment, when the bypass control signal BP=1, the semiconductor memory device 110 operates in the bypass mode. When the bypass control signal BP=1, the inversion bypass control signal /wbp outputted from the write control circuit 12 becomes "0". Then, the output of the inverter circuit 15a becomes "1" in the data switch circuit 150 of the input buffer circuit 15, and the output of the OR circuits 15b, 15c is constantly "1" regardless of the value of the inversion write control signal circuit 15a. Thereby, in the bypass mode, the bit line driver circuit 151 constantly gives the write bit line WBA a signal at the same logic level as that of the input data D[i], while constantly giving the write bit line WBB a signal at the opposite logic level to that of the input data D[i].

When the bypass control signal BP=1, the inversion bypass control signal /bp=0. As a result, the signal BA shows the same logic level as that of the signal transmitted through the write bit line WBA, and the signal BB shows the same logic level as that of the signal transmitted through the write bit line WBB. Meanwhile, when the bypass control signal BP=1, the internal read control signal rpc becomes "0". Then, the output from the sense amplifier circuit 60 is constantly "1". Therefore, the input data D[i] is outputted from the output selection circuit 160, and the input data D[i] is outputted from the output port OUTi.

As thus described, in the semiconductor memory device 110 according to the second embodiment, the write bit lines WBA, WBB, originally extended from the input buffer circuit 15 to the memory cell array 1 for fulfilling essential functions, are extended to the output buffer circuit 16. Thereby, the input data D[i] can be transmitted to the output buffer circuit 16, and then outputted as it is to the input data D[i]. Hence, the bypass function can be realized by use of the write bit lines WBA, WBB, to simplify the layout structure more than the semiconductor memory device 100 according to the first embodiment which realizes the bypass function by use of the bypass line BPL arranged separately from the write bit lines WBA, WBB. This can thus allows size reduction of the device and simplification of the device production process.

It should be noted that the present embodiment can be applied even to a layout structure where the memory cell array 1 is not arranged between the input buffer circuit 15 and the output buffer circuit 16.

Third Embodiment

FIGS. 13 to 16 are plan views schematically showing a circuit configuration of a semiconductor memory device according to a third embodiment of the present invention. The semiconductor memory device according to the third embodiment is a device formed by arranging, in the semiconductor memory device 110 according to the second embodiment, n memory cell arrays 21 in place of the n memory cell arrays 1, a write control circuit 22 in place of the write control circuit 12, a read control circuit 33 in place of the read control circuit 3, a decoder circuit 24 in place of the decoder circuit 4, n input buffer circuits 25 in place of the n input buffer circuits 15, and n output buffer circuits 26 in place of the output buffer circuits 16. As in the second embodiment, one input buffer circuit 25, one output buffer circuit 26 and one memory cell array 1 constitute one group. The layout of the memory cell array 21, the write control circuit 22, the read control circuit 23, the decoder circuit 24, the input buffer circuit 25 and the output buffer circuit 26 is the same as the layout of the memory cell array 1, the write control circuit 12, the read control circuit 3, the decoder circuit 4 and the input buffer circuit 15 and the output buffer circuit 16.

Figure 13:
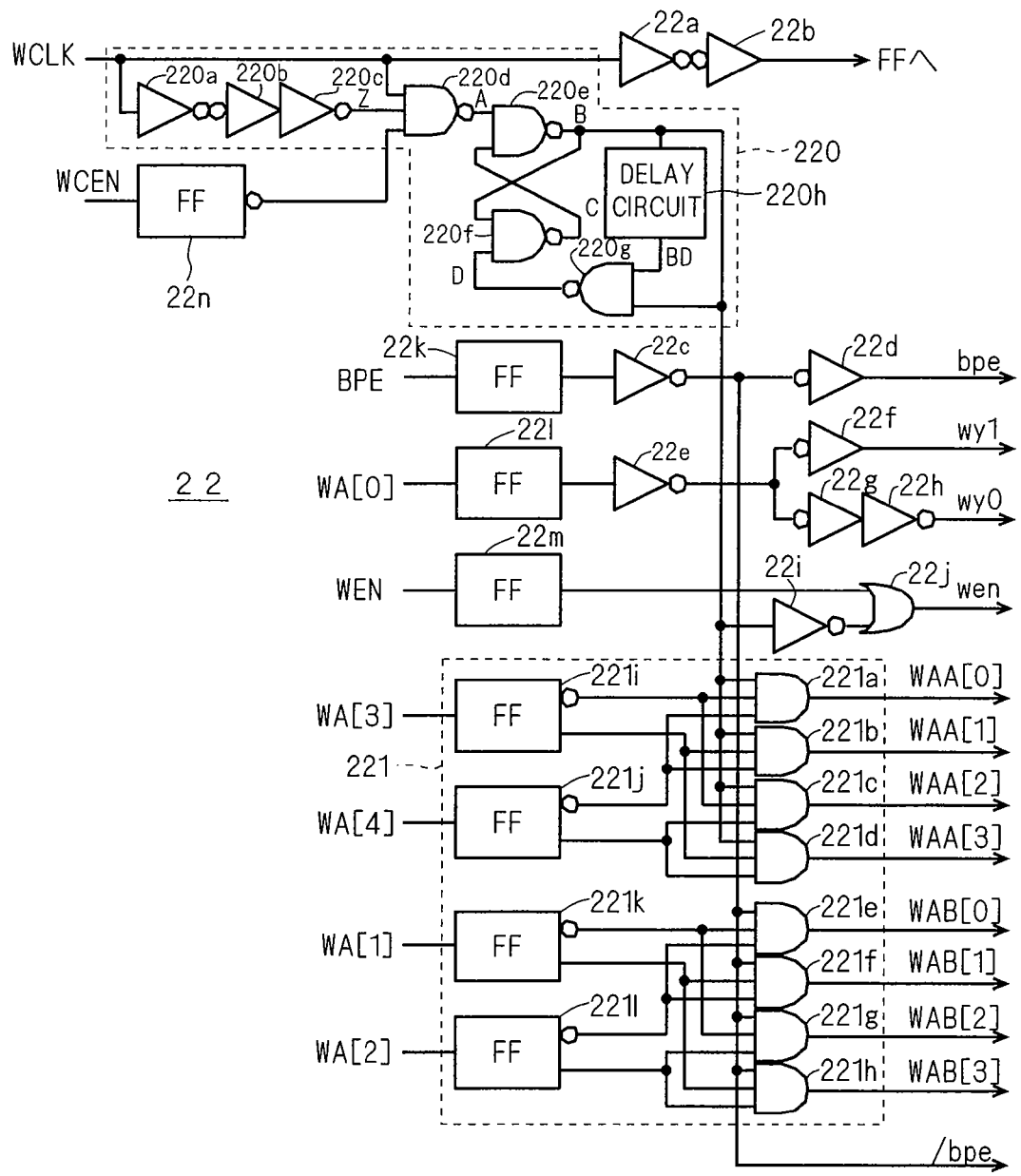
FIG. 13 is a view showing a circuit configuration of a write control circuit according to a third embodiment of the present invention.

FIG. 13 shows a circuit configuration of the write control circuit 22. As do the aforesaid write control circuits 2, 12, the write control circuit 22 operates in synchronization with the write clock signal WCLK supplied from the outside of the semiconductor memory device, and controls the operations of the input buffer circuit 25 and the memory cell array 21, to control writing of the input data D[n−1:0] to the memory cell array 21 in the semiconductor memory device. As shown in FIG. 13, the write control circuit 22 includes: inverter circuits 22a to 22i, an OR circuit 22j, flip flop circuits 22k to 22n, a timing adjustment circuit 220, and an internal address production circuit 221.

The inverter circuit 22a inverts the write clock signal WCLK and outputs the inverted signal. The inverter circuit 22b inverts the output of the 22a and outputs the inverted signal. The output of the inverter circuit 22b is inputted into the CLK input terminal of each of all the flip flop circuits in the write control circuit 22. The bypass control signal BPE, the write address signal WA[0], the write control signal WEN and the write cell selection control signal WCEN are inputted into D input terminals of the flip flop circuits 22k to 22n. The inverter circuit 22c inverts Q output of the flip flop circuit 22k and outputs the inverted signal as an inversion bypass control signal /bpe. The inverter circuit 22d inverts the inversion bypass control signal /bpe and outputs the inverted signal as an internal bypass control signal bpe. The inverter circuit 22e inverts Q output of the flip flop circuit 22l and outputs the inverted signal. The inverter circuit 22f inverts the output of the inverter circuit 223 and outputs the inverted signal as an output signal wy1. The inverter circuit 22g outputs the output of the inverter circuit 22e, and outputs the inverted signal. The inverter circuit 22h inverts the output of the inverter circuit 22g and outputs the inverted signal as a selection signal wy0.

The timing adjustment circuit 220 includes inverter circuits 220a to 220c, NAND circuits 220d to 220g and a delay circuit 220h. The inverter circuit 220a inverts the write clock signal WCLK and outputs the inverted signal. The inverter circuit 220b inverts the output of the inverter circuit 220a and outputs the inverted signal. The inverter circuit 220c inverts the output of the inverter circuit 220b and outputs the inverted signal as a signal Z. The NAND circuit 220d computes a non-conjunction of the write clock signal WCLK, the signal Z and Q-bar output of the flip flop circuit 22n, and then outputs the non-conjunction as a signal A. The NAND circuit 220e computes a non-conjunction of the signal A and a signal C outputted from the NAND circuit 220f, and then outputs the non-conjunction as a signal B. The NAND circuit 220g computes a non-conjunction of the signal B and the signal BD, and then outputs the non-conjunction as a signal D. The NAND circuit 220f computes a non-conjunction of the signal D and the signal B, and then outputs the non-conjunction as a signal C.

The inverter circuit 22i inverts the signal B outputted from the timing adjustment circuit 220 and outputs the inverted signal. The OR circuit 22j computes a conjunction of Q output of the flip flop circuit 22m and the output of the inverter circuit 22i, and then outputs the conjunction as an inversion write control signal /wen.

The internal address production circuit 221 includes AND circuits 221a to 221h, and flip flop circuits 221i to 221l. Write address signals WA[3], WA[4], WA[1], WA[2] are respectively inputted into D input terminals of the flip flop circuits 221i to 221l. The AND circuit 221a computes a conjunction of the signal B outputted from the timing adjustment circuit 220 and Q-bar output of the flip flop circuit 221i, 221j, and then outputs the conjunction as an internal write address signal WAA[0]. The AND circuit 221b computes a conjunction of the signal B, Q output of the flip flop circuit 221i and Q-bar output of the flip flop circuit 221j, and then outputs the conjunction as an internal write address signal WAA[1]. The AND circuit 221c computes a conjunction of the output of the signal B, Q-bar output of the flip flop circuit 221i and Q output of the flip flop circuit 221j, and then outputs the conjunction as an internal write address signal WAA[3]. The AND circuit 221d computes a conjunction of the output of the signal B and, Q output of the flip flop circuits 221i, 221j, and then outputs the conjunction as an internal write address signal WAA[3].

The AND circuit 221e computes a conjunction the inversion bypass control signal /bpe and Q-bar output of the flip flop circuits 221k, 221l, and then outputs the conjunction as an internal write address signal WAB[0]. The AND circuit 221f computes a conjunction the inversion bypass control signal /bpe, Q output of the flip flop circuit 221k and Q-bar output of the flip flop circuits 221l, and then outputs the conjunction as an internal write address signal WAB[1]. The AND circuit 221g computes a conjunction the inversion bypass control signal /bpe, Q-bar output of the flip flop circuits 221k and Q output of the flip flop circuit 221l, and then outputs the conjunction as an internal write address signal WAB[2]. The AND circuit 221h computes a conjunction of the inversion bypass control signal /bpe and Q output of the flip flop circuit 221k, 221l, and then outputs the conjunction as an internal write address signal WAB[3].

FIG. 14 is a view showing a circuit configuration of the read control circuit 23. In the same manner as the aforesaid read control circuit 3, the read control circuit 23 operates in synchronization with a read clock signal RCLK supplied from the outside of the semiconductor memory device, and controls operations of the output buffer circuit 26 and the memory cell array 1, to control reading of data from the memory cell array 21 in the semiconductor memory device. As shown in FIG. 14, the read control circuit 23 includes inverter circuits 23a to 23e, AND circuits 23f, 23g, a buffer circuit 23h, flip flop circuits 23i, 23j, and the aforesaid timing adjustment circuit 220 and internal address production circuit 221.

The inverter circuit 23a inverts the read clock signal RCLK and outputs the inverted signal. The inverter circuit 23b inverts the output of the 23a and outputs the inverted signal. The output of the inverter circuit 23b is inputted into the CLK internal terminal of each of all the flip flop circuit in the read control circuit 23. The read address signal RA[0] and a read cell selection control signal RCEN are inputted into each of D input terminals of the flip flop circuit 23*i*, 23*j*.

In the timing adjustment circuit 220 in the read control circuit 23, the read clock signal RCLK is inputted into the inverter circuit 220*a*, and the read clock signal RCLK, Q-bar output of the flip flop circuit 23*j* and the output of the 220*c* are inputted into the NAND circuit 220*d*. Other configurations of the time adjustment circuit 220 in the read control circuit 23 are the same as those of the timing adjustment circuit 220. The buffer circuit 23*h* outputs the signal B, outputted from the timing adjustment circuit 220 in the read control circuit 23*k*, with its logic level remained as the internal read control signal rpc.

Read address signals RA[3], RA[4], RA[1], RA[2] are respectively inputted into D input terminals of flip flop circuits 221*i* to 221*l*. Further, the signal B, outputted from the timing adjustment circuit 220 in the read control circuit 23, is inputted into each of the AND circuits 221*a* to 221*d*. The inversion bypass control signal /bpe is not inputted in each of the AND circuits 221*e* to 221*h*. The AND circuit 221*e* computes a conjunction of Q-bar output of the flip flop circuits 221*k*, 221*l*, and then outputs the conjunction as an internal read address signal RAB[0]. The AND circuit 221*f* computes a conjunction of the Q output of the flip flop circuits 221*k* and the Q-bar output of the flip flop circuit 221*l*, and then outputs the conjunction as an internal read address signal RAB[1]. The AND circuit 221*g* computes a conjunction of the Q-bar output of the flip flop circuits 221*k* and the Q output of the flip flop circuit 221*l*, and then outputs the conjunction as an internal read address signal RAB[2]. The AND circuit 221*h* computes a conjunction of the Q output of the flip flop circuits 221*k*, 221*l*, and then outputs the conjunction as an internal read address signal RAB[3]. Other configurations of the internal address production circuit 221 in the read control circuit 23 are the same as those of the internal address production circuit 221 in the write control circuit 22.

The inverter circuit 23*c* inverts the signal D outputted from the timing adjustment circuit 220 and outputs the inverted signal as a signal D. The inverter circuit 23*e* inverts the inversion bypass control signal /bpe outputted from the write control circuit 22 and outputs the inverted signal as an internal bypass control signal rbpe. The inverter circuit 23*d* inverts Q output of the flip flop circuit 23*i* and outputs the inverted signal. The AND circuit 23*f* computes a conjunction of the inversion bypass control signal /bpe and the output of the inverter circuits 23*c*, 23*d*, and then outputs the conjunction as a read cell 0 selection signal ry0. The AND circuit 23*g* computes a conjunction of the inversion bypass control signal /bpe, the output of the inverter circuit 23*c* and the Q output of the flip flop circuit 23*i*, and then outputs the conjunction as a read cell 1 selection signal ry1.

Figure 15:
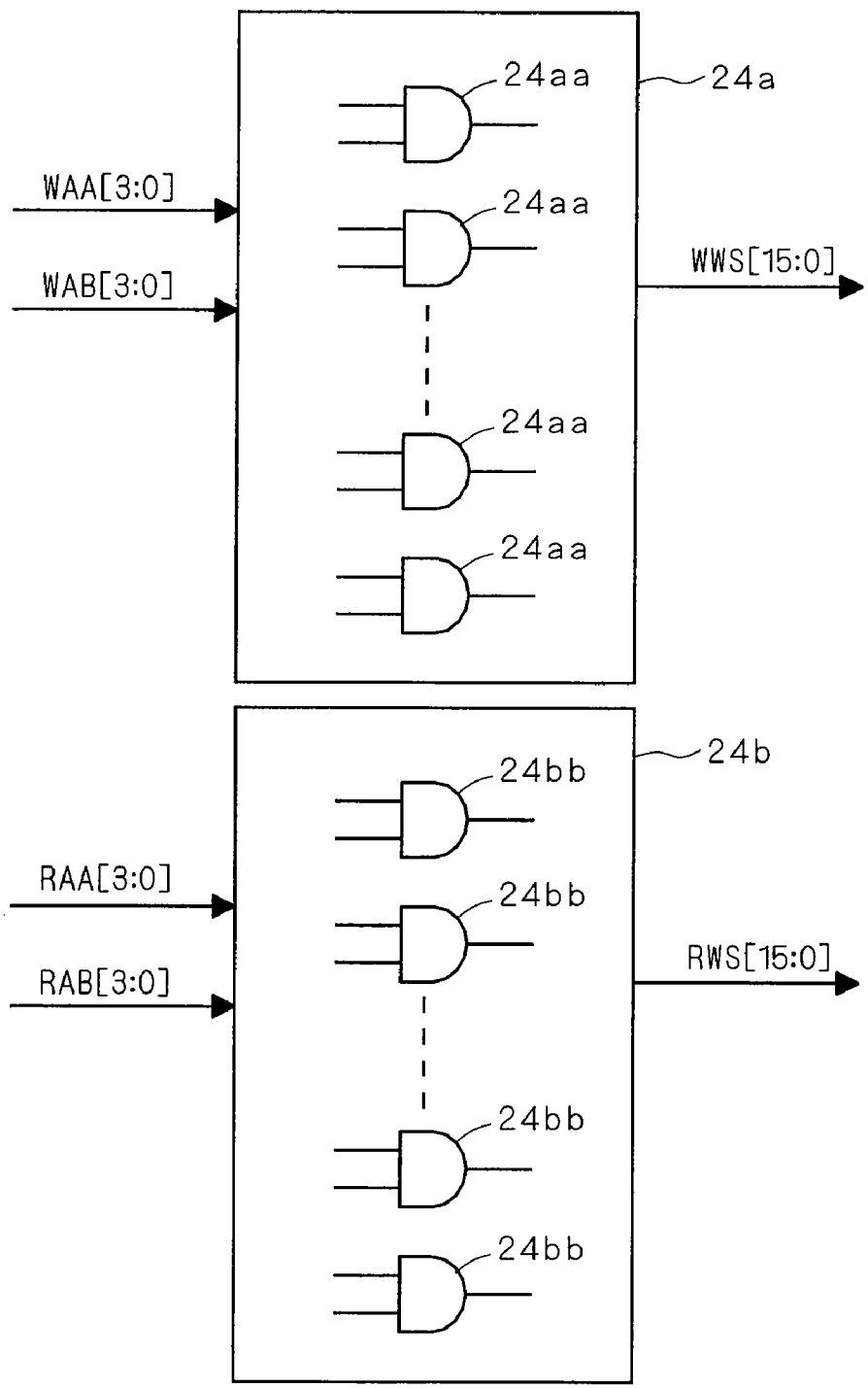
FIG. 15 is a block diagram showing a configuration of a decoder circuit according to the third embodiment of the present invention.

FIG. 15 is a block diagram showing a configuration of the decoder circuit 24. As shown in FIG. 15, the decoder circuit 24 includes: a write word line decoder circuit 24*a* which includes 16 AND circuits 24*aa*; and a read word line decoder circuit 24*b* which includes 16 AND circuits 24*bb*. The write word line decoder circuit 24*a* computes conjunctions of the internal write address signal WAA[0] and the internal write address signals WAB[0] to WAB[3], and then outputs the conjunctions respectively as write word line selection signals WWS[0] to WWS[3]. The write word line decoder circuit 24*a* also computes conjunctions of the internal write address signal WAA[1] and the internal write address signals WAB[0] to WAB[3], and then outputs the conjunctions respectively as write word line selection signals WWS[4] to WWS[7]. The write word line decoder circuit 24*a* also computes conjunctions of the internal write address signal WAA[2] and the internal write address signals WAB[0] to WAB[3], and then outputs the conjunctions respectively as write word line selection signals WWS[8] to WWS[11]. The write word line decoder circuit 24*a* also computes conjunctions of the internal write address signal WAA[3] and the internal write address signals WAB[0] to WAB[3], and then outputs the conjunctions respectively as write word line selection signals WWS[12] to WWS[15]. It should be noted that a 16-bit write word line selection signal WWS[15:0] is outputted from each of the 16 AND circuits 24*aa* in the write word line decoder circuit 24*aa*.

In the same manner, the read word line decoder circuit 24*b* computes conjunctions of the internal read address signal RAA[0] and the internal read address signals RAB[0] to RAB[3], and then outputs the conjunctions respectively as read word line selection signals RWS[0] to RWS[3]. The read word line decoder circuit 24*b* also computes conjunctions of the internal read address signal RAA[1] and the internal read address signals RAB[0] to RAB[3], and then outputs the conjunctions respectively as read word line selection signals RWS[4] to RWS[7]. The read word line decoder circuit also 24*b* computes conjunctions of the internal read address signal RAA[2] and the internal read address signals RAB[0] to RAB[3], and then outputs the conjunctions respectively as read word line selection signals RWS[8] to RWS[11]. The read word line decoder circuit 24*b* computes conjunctions of the internal read address signal RAA[3] and the internal read address signals RAB[0] to RAB[3], and then outputs the conjunctions respectively as read word line selection signals RWS[12] to RWS[15]. It should be noted that a 16-bit read word line selection signal RWS[15:0] is outputted from each of the 16 AND circuits 24*bb* in the read word line decoder circuit 24*bb*.

FIG. 16 is a view showing a circuit configuration and a layout structure in plan view of the memory cell array 21, the input buffer circuit 25 and the output buffer circuit 26. The input buffer circuit 25 receives input data D[i] inputted into the input port INi, and outputs the input data D[i] to the memory cell array 21 based upon the inversion write control signal /wen outputted from the write control circuit 22, the internal bypass control signal bpe, the write cell 0 selection signal wy0 and the write cell 1 selection signal wy1. As shown in FIG. 16, the input buffer circuit 25 includes a flip flop circuit 25*a*, a NOR circuit 25*b*, AND circuits 25*c*, 25*d*, an inverter circuit 25*e*, and two data output control circuits 250. The input data D[i] is inputted into a D input terminal of the flip flop circuit 25*a*, and Q output thereof is outputted as data d[i]. Further, the output of the inverter circuit 22*b* in the write control circuit 22 is inputted into a CLK input terminal in the flip flop circuit 25*a*. The NOR circuit 25*b* computes a non-conjunction of the inversion bypass control signal /bpe and the write cell 1 selection signal wy1, and then outputs the non-conjunction. The AND circuit 25*c* computes a conjunction of an inversion signal of the output of the NOR circuit 25*b* and an inversion signal of the internal write control signal wen, and then outputs the conjunction. The AND circuit 25*d* computes a conjunction of an inversion signal of the inversion bypass control signal /bpe, the write cell 0 selection signal wy0, and an inversion signal of the internal write control signal wen, and then outputs the conjunction.

Each of the data output control circuits 250 includes inverter circuits 250*a* to 250*c*, transmission gates 250*d*, 250*e*, and PMOS transistors 250*f* to 205*h*. In each of the data output control circuits 250, the inverter circuit 250*a* inverts data d[i] and outputs the inverted signal. The inverter circuit 250*b* inverts the output of the inverter circuit 250*a*, and inputs the inverted signal into an input terminal of the transmission gate 250d. Further, in each of the data output control circuits 250, the output of the inverter circuit 250a is inputted into an input terminal of the transmission gate 250e. The output of the inverter circuit 250c is inputted into each of negative logic control terminals of the transmission gates 250e, 250e.

In one of the data output control circuits 250, output of the AND circuit 25c is inputted into an input terminal of the inverter circuit 250c and each of positive logic control terminals of the transmission gates 250d, 250e, and output terminals of the transmission gates 250d, 250e are respectively connected to the write bit lines WBA1, WBB1.

In the other of the data output control circuits 250, output of the AND circuit 25d is inputted into an input terminal of the inverter circuit 250c and each of a control terminals of the transmission gates 250d, 250e, and output terminals of the transmission gates 250d, 250e are respectively connected to the write bit line WBA0, WBB0.

In each of the data output control circuits 250, a power potential is applied to each of source terminals of PMOS transistors 250f, 250h. Output of the inverter circuit 25e is inputted into gate terminals of the PMOS transistors 250f to 250h.

In one of the data output control circuits 250, a drain terminal of the PMOS transistor 250f and a source terminal of the PMOS transistor 250g are connected to the write bit line WBA1, and drain terminals of the PMOS transistors 250g, 250h are connected to the write bit line WBB1. In the other of the data output control circuits 250, the drain terminal of the PMOS transistor 250f and the source terminal of the PMOS transistor 250g are connected to the write bit line WBA0, and the drain terminals of the PMOS transistor 250g, 250h are connected to the write bit line WBB0.

In this example, one memory cell array 21 includes: a memory cell column MCG0 composed of 16 memory cells MC; and a memory cell column MCG1 composed of 16 memory cells MC. On each of the memory cell columns MCG0, MCG1, the 16 memory cells MC are aligned in a row along the X-axis direction in the layout structure in plan view. The memory cell column MCG0 and the memory cell column MCG1 are aligned along the Y-axis direction in the layout structure in plan view, and in the whole of one memory array 1, 32 memory cells MC are arranged in a matrix of 16 rows in the X-axis direction and 2 columns in the Y-axis direction. Accordingly, in the whole of n memory arrays 1, 32 memory cells MC are arranged in a matrix of 16 columns in the X-axis direction and (2×n) rows in the Y-axis direction.

Each of the memory cells MC includes NMOS transistors 210a to 210d and inverter circuits 210e, 210f. In each of the memory cells MC, source terminals of the NMOS transistors 210a, 210c, an input terminal of the inverter circuit 210e and an output terminal of the 210f are connected to one another, and source terminals of the NMOS transistors 210b, 210d, an output terminal of the inverter circuit 210e and an input terminal of the 210f are connected to one another.

In each of the memory cells MC in the memory cell column MCG0, a drain terminal of the NMOS transistor 210a is connected to a read bit line RBA0, and a drain terminal of the NMOS transistor 210b is connected to a read bit line RBB0. Meanwhile, in each of the memory cells MC in the memory cell column MCG1, the drain terminal of the NMOS transistor 210a is connected to a read bit line RBA1, and the drain terminal of the NMOS transistor 210b is connected to a read bit line RBB1.

Further, in each of the memory cells MC in the memory cell column MCG0, a drain terminal of the NMOS transistor 210c is connected to a write bit line WBA0, and a drain terminal of the NMOS transistor 210d is connected to a write bit line WBB0. Meanwhile, in each of the memory cells MC in the memory cell column MCG1, a drain terminal of the NMOS transistor 210c is connected to a write bit line WBA1, and a drain terminal of the NMOS transistor 210d is connected to a write bit line WBB1.

In each of memory cell columns MCG0, MCG1, 16 write word lines WWL[15:0] are respectively connected to gate terminals of the NMOS transistor 210c, 210d in 16 memory cells MC, and write word line selection signals WWS[0] to WWS[15] outputted from the decoder circuit 24 are respectively given to the write word lines WWL[0] to WWL[15]. Further, in each of memory cell columns MCG0, MCG1, 16 read word lines RWL[15:0] are respectively connected to gate terminals of the NMOS transistors 210a, 210b in 16 memory cells MC, and read word line selection signals RWS[0] to RWS[15] outputted from the decoder circuit 24 are respectively given to the read word lines RWL[0] to RWL[15]. As in the second embodiment, the write word line WWL[j] is paired with the read word line RWL[j], and those word lines are connected to the same memory cell MC.

In the semiconductor memory device according to the third embodiment, as in the second embodiment, the write bit lines WBA1, WBB1, extending from the input buffer circuit 25 to memory cell column MCG1 of the memory cell array 21, is extended from the memory cell column MCG1 to the output buffer circuit 26, and connected to this output buffer circuit 26. It is to be noted that the write bit lines WBA0, WBB0 extending from the input buffer circuit 25 to memory cell column MCG0 are not extended to the output buffer circuit 26, nor connected thereto.

The output buffer circuit 26 outputs the received data as output data Q[i] to the output port OUTi based upon the internal read control signal rpc outputted from the lead control circuit 23, the internal bypass control signal rbpe, a read cell 0 selection signal ry0, and the read cell 1 selection signal ry1. As shown in FIG. 16, the output buffer circuit 26 includes: two latch circuits 260, tri-state inverter circuits 26a to 26c, inverter circuits 26d to 26f, an OR circuit 26g, and an NAND circuit 26h. Each of the latch circuits 260 includes three PMOS transistors 260a to 260c, an NAND circuit 260d and an OR circuit 260e. In each of the latch circuits 260, a power potential is applied to source terminals of PMOS transistor 260a to 260c, and the internal read control signal rpc, outputted from the read control circuit 23, is inputted into each of gate terminals of the PMOS transistors 260a to 260c.

In one of the latch circuits 260, the read bit line RBA0 extending from the memory cell column MCG0 is connected to one of input terminals of the NAND circuit 260d. The NAND circuit 260d computes a non-conjunction of a signal transmitted through the read bit line RBA0 and output of the OR circuit 260e, and then outputs the non-conjunction as a signal QC. In the other of the latch circuits 260, the read bit line RBB0 extending from the memory cell column MCG0 is connected to one of input terminals of the OR circuit 260e. The AND circuit 260d computes a conjunction of an inversion signal of a signal transmitted through the read bit line RBB0 and an inversion signal of output of the AND circuit 260d, and then outputs the conjunction.

In the other of the latch circuits 260, the read bit line RBA1 extending from the memory cell column MCG1 is connected to one of the input terminals of the NAND circuit 260d. The NAND circuit 260d computes a non-conjunction of a signal transmitted through the read bit line RBA1 and the output of the OR circuit 260e, and then outputs the non-conjunction as a signal QA. In the other of the latch circuits 260, the read bit line RBB1 extending from the memory cell column MCG1 is connected to one of the input terminals of the OR circuit 260e. The OR circuit 260e computes a conjunction of an inversion signal of a signal transmitted through the read bit line RBB 1 and the inversion signal of the output of the AND circuit 260d, and then outputs the conjunction.

The write bit line WBB1 extending from the memory cell column MCG1 is connected to one of inputs of the OR circuit 26g, and the OR circuit 26g computes a conjunction of an inversion signal of a signal transmitted through the write bit line WBB 1 and an inversion signal of output of the NAND circuit 26h, and then outputs the conjunction. The write bit line WBA1 extending from the memory cell column MCG1 is connected to one of inputs of the NAND circuit 26h, and the NAND circuit 26h computes a non-conjunction of a signal transmitted through the write bit line WBA1 and output of the OR circuit 26g, and then outputs the non-conjunction as a signal QB.

Activation and inactivation of each of the tri-state inverter circuits 26a to 26c are controlled by means of the read cell 1 selection signal ry1, the read cell 0 selection signal ry0 and the internal bypass control signal rbpe. Signals QA to QC are respectively inputted into input terminals of the tri-state inverter circuits 26a to 26c. Output terminals of those circuits are connected to an input terminal of the inverter circuit 26e and an output terminal of the inverter circuit 26d. An output terminal of the inverter circuit 26e and an input terminal of the inverter circuit 26d are connected to each other. The 26f inverts output of the inverter circuit 26e and outputs the inverted signal as output data Q[i] to the output port OUTi.

Next, the operation of the semiconductor memory device according to the third embodiment is described. FIG. 17 is a timing chart showing operations of the writhe control circuit 22 and the read control circuit 23 according to the third embodiment. In FIG. 17, the write clock signal WCLK and the read clock signal RCLK are collectively called "clock signal CLK", while the write word line selection signal WWS[i] and the read word line selection signal RWS[i] are collectively called "word line selection signal WS".

When the write control signal WEN and the write selection control signal WCEN both become "0", as shown in FIG. 17, a negative polarity pulse signal is outputted as the internal write control signal wen from the write control circuit 22. Further, when the cell selection control signal RCEN becomes "0", as shown in FIG. 17, a positive polarity pulse signal is outputted as the internal read control signal rpc from the read control circuit 23.

When the bypass control signal BPE=0, the semiconductor memory device according to the third embodiment operates in the normal operation mode. When the bypass control signal BPE=0, the internal bypass control signal bpe outputted from the write control circuit 22 becomes "0" and the internal bypass control signal rbpe outputted from the read control circuit 23 also becomes "0". In a write mode where the input data D[i] is written into the memory cell array 21, the write control signal WEN and the write cell selection control signal WCEN both become "0". Then, a negative polarity pulse signal is outputted from the write control circuit 22 as the internal write control signal wen as shown in FIG. 17, and by the action of the write control circuit 22 and the decoder circuit 24, any one of the write word line selection signals WWS[15:0] becomes "1" according to a value of the write address signal WA[4:1] to activate any one of the write word line WWL[15:0]. Further, according to a value of the write address signal WA[0], either the write cell 0 selection signal wy0 or the write cell 1selection signal wy1 becomes "1".

When the internal bypass control signal bpe=0, the input buffer circuit 25 outputs the input data D[i] to either a pair of bit lines composed of the write bit line WBA0, WBB0, and a pair of bit lines composed of the write bit line WBA1, WBB1, based upon the write cell 0 selection signal wy0 and the write cell 1selection signal wy1.

When the internal bypass control signal bpe=0, the write cell 0 selection signal wy0=1 and the write cell 1selection signal wy1=0, in the input buffer circuit 25, output of the transmission gates 250d, 250e connected to the write bit line WBA1, WBB1 become high impedance. When the internal write control signal wen becomes "0", the transmission gates 250d, 250e connected to the write bit lines WBA0, WBB0, outputs an input signal as it is. Thereby, the input data D[i] is written into the memory cell MC connected to the activated word line WWL[j] among the plurality of memory cells MC in the memory cell column MCG0.

Meanwhile, when the internal bypass control signal bpe=0, the write cell 0 selection signal wy0=0 and the write cell 1selection signal wy1=1, in the input buffer circuit 25, output of the transmission gates 250d, 250e connected to the write bit line WBA0, WBB0 is constantly high impedance. When the internal write control signal wen becomes "0", the transmission gates 250d, 250e connected to the write bit lines WBA0, WBB0 output an input signal as it is. Thereby, the input data D[i] is written into the memory cell MC connected to the activated word line WWL[j] among the plurality of memory cells MC in the memory cell column MCG1.

In the read mode where data is read from the memory cell array 21, the read cell selection control signal RCEN becomes "0" as in the second embodiment. Then, a positive polarity pulse signal is outputted as the internal read cell selection control signal rpc from the read control circuit 23, and any one of the read word line selection lines RWL[15:0] is activated according to a value of the read address signal RA[4:1]. Further, either the read cell 0 selection signal ry0 or the read cell 1 selection signal ry1 becomes "1" according to a value of the read address signal RA[0].

When the read word line RWL[j] is activated, data is read from the memory cell MC in each of the memory cell columns MCG0, MCG1, being connected to the read word line RWL [j]. The data is then transmitted to the latch circuit 260 in the output buffer circuit 26 through the read bit lines RBA, RBB, and the read bit lines RBA1, RBB1. When the internal read control signal rpc becomes "1", data read from the memory cell MC is held in the latch circuit 260, and then inputted into input terminals of the tri-state inverter circuits 26a, 26c.

When the internal bypass control signal rbpe becomes "0", the output buffer circuit 26 outputs data Q[i] transmitted through either a pair of bit lines composed of the read bit line RBA0, RBB0, or a pair of bit lines composed of the read bit line RBA1, RBB1, based upon the read cell 0 selection signal ry0 and the read cell 1 selection signal ry1.

When the internal bypass control signal rbpe=0, the read cell 0 selection signal ry0=1 and the read cell 1 selection signal ry1=0, the tri-state inverter circuit 26c is activated and the tri-state inverter circuits 26a, 26b are inactivated in the output buffer circuit 26. Thereby, data read from the memory cell MC in the memory cell column MCG0 is outputted as the output data Q[i].

Meanwhile, when the internal bypass control signal rbpe=0, the read cell 0 selection signal ry0=0 and the read cell 1 selection signal ry1=1, the tri-state inverter circuit 26a is activated and the tri-state inverter circuits 26b, 26c are inactivated in the output buffer circuit 26. Thereby, data read from the memory cell MC in the memory cell column MCG1 is outputted as the output data Q[i].

Next, the bypass mode is described. When the bypass control signal BPE=1, the semiconductor memory device according to the third embodiment operates in the bypass mode. When the bypass control signal BPE=1, the internal bypass control signal bpe outputted from the write control circuit 22 becomes "1". Then, output of the AND circuit 25d becomes "0", and output of the transmission gates 250d, 250e connected to the write bit line WBA0, WBB0 become high impedance. The transmission gates 250d, 250e, connected to the write bit line WBA1, WBB1, output an input signal as it is when the internal write control signal wen becomes "0". In the bypass mode, since the internal write control signal wen becomes 0, a signal at the same logic level as that of the input data D[i] is given to the write bit line WBA 1, and a signal at the opposite logic level to that of the input data D[i] is given to the write bit line WBB1.

when the bypass control signal BPE=1, the read cell 0 selection signal ry0 and the read cell 1 selection signal ry1 outputted from the read control circuit 23 become "0", and the internal bypass control signal rbpe becomes "1". Thereby, the tri-state inverter circuits 26a, 26c are inactivated, and the tri-state inverter circuit 26b is activated. The input data D[i] as the output data Q[i] is outputted from the inverter circuit 26f.

As thus described, in the semiconductor memory device according to the third embodiment, as in the semiconductor memory device 110 according to the second embodiment, the write bit lines WBA1, WBB1, originally extended from the input buffer circuit 25 to the memory cell array 21 for fulfilling essential functions, are extended to the output buffer circuit 26. Thereby, the input data D[i] can be transmitted to the output buffer circuit 26, and then outputted as it is to the output port OUTi. In this manner, the bypass function can be realized by use of the write bit lines WBA1, WBB1, to simplify the layout structure more than the semiconductor memory device 100 according to the first embodiment. This can thus allows size reduction of the device and the simplification of the device production process.

It should be noted that the present embodiment can be applied even to a layout structure where the memory cell array 21 is not arranged between the input buffer circuit 25 and the output buffer circuit 26.

Fourth Embodiment

Figure 19:
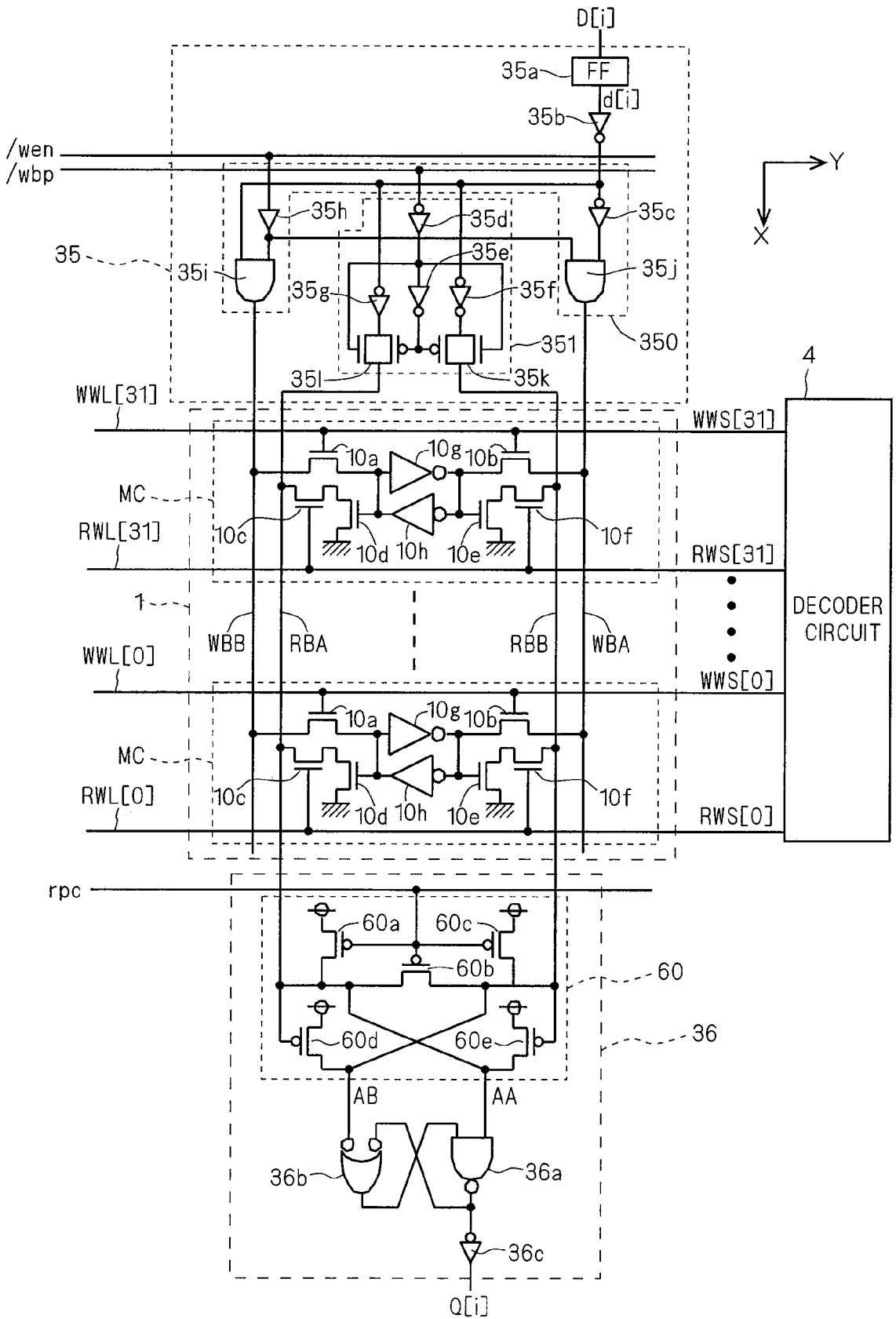
FIG. 19 is a view showing a circuit configuration and a layout structure in plan view of a memory cell array, an input buffer circuit and an output buffer circuit according to the fourth embodiment of the present invention.

FIGS. 18, 19 are plan views schematically showing a circuit configuration of a semiconductor memory device according to a fourth embodiment of the present invention. The semiconductor memory device according to the fourth embodiment is a device formed by arranging, in the semiconductor memory device 110 according to the second embodiment, a read control circuit 33 in place of the read control circuit 3, n input buffer circuits 35 in place of the n input buffer circuits 15, and n output buffer circuits 36 in place of the n output buffer circuits 16. As in the second embodiment, one input buffer circuit 35, one output buffer circuit 36 and one memory cell array 1 constitute one group. The layout of the read control circuit 33, the input buffer circuit 35 and the output buffer circuit 36 is the same as that of the read control circuit 3, the input buffer circuit 15 and the output buffer circuit 16 according to the second embodiment.

FIG. 18 shows a circuit configuration of the read control circuit 33. As shown in FIG. 18, the read control circuit 33 includes, in the aforesaid read control circuit 3 according to the second embodiment, an OR circuit 33a and an AND circuit 33b in place of the buffer circuit 3d and a buffer circuit 33c. The OR circuit 33a computes a conjunction of output of the AND circuit 3e and the internal bypass control signal bp, and then outputs the conjunction. The buffer circuit 33c outputs the output of the OR circuit 33a with its logic level remained as an internal read control signal rpc. The AND circuit 33b computes a conjunction of output of the inverter circuit 3a and output of the AND circuit 3e, and then outputs the conjunction.

In the internal address production circuit 20 in the read control circuit 33 according to the fourth embodiment, the output of the AND circuit 33b is inputted, in place of the output of the AND circuit 3e, into each of the AND circuits 20a to 20l. Since other configurations are the same as those of the read control circuit 3 according to the second embodiment, descriptions of those configurations are omitted.

FIG. 19 is a view showing a circuit configuration and a layout structure in plan view of the memory cell array 1, the input buffer circuit 35 and the output buffer circuit 36 in one group. The input buffer circuit 35 receives input data D[i] inputted into the input port INi, and outputs the input data D[i] to the memory cell array 1 based upon the inversion write control signal /wen outputted from the write control circuit 12 and the inversion bypass control signal /wbp. As shown in FIG. 18, the input buffer circuit 35 includes a flip flop circuit 35a, an inverter circuit 35b, a bit line driver circuit 350, and a bit line switch circuit 351.

The input data D[i] is inputted into a D input terminal of the flip flop circuit 35a, and Q output thereof is outputted as data d[i]. Output of the inverter circuit 2b in the write control circuit 12 is inputted into a CLK input terminal of the flip flop circuit 35a. The inverter circuit 35b inverts the data d[i], and outputs the inverted signal.

The bit line driver circuit 350 includes an inverter circuit 35c, a buffer circuit 35h, and AND circuits 35i, 35j. The inverter circuit 35c inverts output of the inverter circuit 35b and outputs the inverted signal. The buffer circuit 35h outputs the inversion write control signal /wen outputted from the write control circuit 12 and outputs the inverted signal with its logic level remained. The write bit lines WBA, WBB are respectively connected to output terminals of the AND circuits 35j, 35i. The AND circuit 35j computes a conjunction of the output of the inverter circuit 35c and the output of the buffer circuit 35h, and then output the conjunction to the write bit line WBA. The AND circuit 35i computes a conjunction of the output of the inverter circuit 35b and the output of the buffer circuit 35h, and then output the conjunction to the write bit line WBB.

The bit line switch circuit 351 includes inverter circuits 35d, 35e, 35g, a buffer circuit 35f, and transmission gates 35k, 35l. The inverter circuit 35d inverts the inversion bypass control signal /wbp outputted from the write control circuit 12 and outputs the inverted signal. The inverter circuit 35e inverts output of the inverter circuit 35d and inputs the inverted signal into each of negative logic control terminals of the transmission gates 35k, 35l. The inverter circuit 35g inverts the output of the inverter circuit 35b and outputs the inverted signal to an input terminal of the transmission gate 35k. The buffer circuit 35f outputs the output of the inverter circuit 35b with its logic level remained to the input terminal of the transmission gate 35k. The output of the inverter circuit 35d is inputted into each of positive logic control terminals of the transmission gates 35k, 35l.

In the second embodiment, the write bit lines WBA, WBB are extended from the memory cell array 1 to the output buffer circuit 16. However, in the fourth embodiment, the read bit lines RBA, RBB are extended from the memory cell array 1 to the input buffer circuit 35 in place of extending the write bit lines WBA, WBB to the output buffer circuit 16. The extended read bit lines RBA, RBB are respectively connected to output terminals of the transmission gates 35l, 35k.

The output buffer circuit 36 outputs the received data as output data Q[i] to the output port OUTi based upon the internal read control signal rpc outputted from the read control circuit 33. As shown in FIG. 19, the output buffer circuit 36 includes: the aforesaid sense amplifier circuit 60, an NAND circuit 36a, an OR circuit 36b and an inverter circuit 36c. A drain terminal of the PMOS transistor in the sense amplifier circuit 60 is connected to one of input terminals of the OR circuit 36b. The OR circuit 36b computes a conjunction of an inversion signal of an output signal AB of the sense amplifier circuit 60 and an inversion signal of output of the NAND circuit 36b. A drain terminal of the PMOS transistor 60e in the sense amplifier circuit 60 is connected to one of input terminals of the NAND circuit 34a. The NAND circuit 34a computes a non-conjunction of an output signal AA of the sense amplifier circuit 60 and the output of the OR circuit 36b, and then outputs the non-conjunction. The inverter circuit 36c inverts the output of the NAND circuit 36a, and outputs the inverted signal as output data Q[i] to the output port OUTi.

Next, the operation of the semiconductor memory device according to the fourth embodiment is described. As in the second embodiment, when the bypass control signal BP=0, the semiconductor memory device according to the fourth embodiment operates in the normal operation mode. When the bypass control signal BP=0, the internal bypass control signal bp outputted from the write control circuit 12 and the inversion bypass control signal /wbp both become "1". Then, output of the transmission gates 35k, 35l both become high impedance. This prevents output of the input data D[i] from the bit line switch circuit 351 to the read bit lines RBA, RBB.

In the write mode where the input data D[i] is written into the memory cell array 1, the bit line driver circuit 350 outputs the input data D[i] to the write bit lines WBA, WBB based upon the inversion write control signal /wen. As in the second embodiment, in the write mode, the write control signal WEN and the write cell selection control signal WCEN both become "0". Then, a positive polarity pulse signal is outputted as the inversion write control signal /wen from the write control circuit 12, and by the action of the write control circuit 12 and the decoder circuit 4, any one of the write word line selection signals WWS[31:0] becomes "1" according to a value of the write address signal WA[4:0] to activate any one of the write word line WWL[31:0]. When the inversion write control signal /wen becomes "1", the input data D[i] is outputted from the bit line driver circuit 350, and then written into the memory cell MC connected to the activated write word line WWL[j].

In the read mode where data is read from the memory cell array 1, as in the second embodiment, the cell selection control signal RCEN becomes "0", a positive polarity pulse signal as the internal read control signal rpc is outputted from the read control circuit 33, and any one of the read word line RWL[31:0] is activated. When the read word line RWL[j] is activated, data is read from the memory cell MC connected thereto, and transmitted to the sense amplifier circuit 60 in the output buffer circuit 36 through the read bit lines RBA, RBB.

When the internal read control signal rpc becomes "1", the data read from the memory cell MC is amplified in and outputted from the sense amplifier circuit 60. Thereby, the data read from the memory cell MC is outputted from the inverter circuit 36c as the output data Q[i].

Next, the bypass mode is described. As in the second embodiment, when the bypass control signal BP=1, the semiconductor memory device according to the fourth embodiment operates in the bypass mode. When the bypass control signal BP=1, the inversion bypass control signal /wbp outputted from the write control circuit 12 becomes "0". Then, each of the transmission gates 35k, 35l outputs an input signal as it is to the output terminal. Hence, a signal at the same logic level as that of the data D[i] is outputted from the transmission gate 35k, and transmitted to the output buffer circuit 36 through the read bit line RBA. Further, a signal at the opposite logic level to that of the data D[i] is outputted from the transmission gate 35l, and transmitted to the output buffer circuit 36 through the read bit line RBB. The signals transmitted through the read bit lines RBA, RBB are respectively inputted to the NAND circuit 36a and the OR circuit 36b. Thereby, the input data D[i] is outputted as the output data Q[i] from the inverter circuit 36c.

As thus described, in the semiconductor memory device according to the fourth embodiment, the write bit lines WBA, WBB, originally extended from the input buffer circuit 15 to the memory cell array 1 for the purpose of fulfilling essential functions, are extended to the input buffer circuit 35. Thereby, the input data D[i] can be transmitted to the output buffer circuit 36, and then outputted as it is to the output port OUTi. In this manner, the bypass function can be realized by use of the read bit lines RBA, RBB, to simplify the layout structure more than the semiconductor memory device 100 according to the first embodiment which transmits the input data D[i] to the output buffer circuit 6 by use of the bypass line BPL provided separately from the read bit lines RBA, RBB. This can thus allows size reduction of the device and simplification of the device production process.

It should be noted that the present embodiment can be applied even to a layout structure where the memory cell array 1 is not arranged between the input buffer circuit 35 and the output buffer circuit 36.

Moreover, in the aforesaid semiconductor device 600 shown in FIG. 6, the semiconductor memory devices according to the second to fourth embodiments may be used as the semiconductor memory device in place of the semiconductor memory device 100 according to the first embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a semiconductor memory section that has a write mode, a read mode and a bypass mode, wherein
said semiconductor memory section includes:
a memory cell array having a plurality of memory cells arranged in a predetermined direction;
an input port;
an output port;
a plurality of read word lines respectively connected to said plurality of memory cells in said memory cell array;
a plurality of write word lines respectively connected to said plurality of memory cells in said memory cell array;
a decoder circuit which activates any one of said plurality of write word lines in said write mode, and activates any one of said plurality of read word lines in said read mode;
an input buffer circuit which receives data inputted into said input port, and outputs the received data;
a write bit line which extends from said input buffer circuit to said memory cell array, and transmits data outputted from said input buffer circuit to said memory cell array;
an output buffer circuit which outputs received data to said output port; and a read bit line which extends from said memory cell array to said output buffer circuit, and transmits data from said memory cell array to said output buffer circuit, said write bit line is extended from said memory cell array to said output buffer circuit, and said output buffer circuit outputs data transmitted through said read bit line to said output port in said read mode, and outputs data transmitted through said write bit line to said output port in said bypass mode, wherein a data switch circuit which outputs data, having been inputted into said input port, based upon a control signal in said write mode, and outputs data, having been inputted into said input port, regardless of said control signal in said bypass mode; and a bit line driver circuit which receives data outputted from said data switch circuit, and outputs the received data to said write bit line, and said output buffer circuit has:

a sense amplifier circuit which amplifies data transmitted through said read bit line, and outputs the amplified data; and an output selection circuit which outputs data from said sense amplifier circuit to said output port in said read mode, and outputs data transmitted through said write bit line to said output port in said bypass mode.

2. The semiconductor device according to claim 1, wherein in the layout structure in plan view, said memory cell array is arranged between said input buffer circuit and said output buffer circuit.

3. A semiconductor device comprising a semiconductor memory section that has a write mode, a read mode and a bypass mode, wherein said semiconductor memory section includes:

a memory cell array having a plurality of memory cells arranged in a predetermined direction;

an input port;

an output port;

a plurality of read word lines respectively connected to said plurality of memory cells in said memory cell array;

a plurality of write word lines respectively connected to said plurality of memory cells in said memory cell array;

a decoder circuit which activates any one of said plurality of write word lines in said write mode, and activates any one of said plurality of read word lines in said read mode;

an input buffer circuit which receives data inputted into said input port, and outputs the received data;

a write bit line which extends from said input buffer circuit to said memory cell array, and transmits data outputted from said input buffer circuit to said memory cell array;

an output buffer circuit which outputs received data to said output port; and a read bit line which extends from said memory cell array to said output buffer circuit, and transmits data from said memory cell array to said output buffer circuit, said write bit line is extended from said memory cell array to said output buffer circuit, and said output buffer circuit outputs data transmitted through said read bit line to said output port in said read mode, and outputs data transmitted through said write bit line to said output port in said bypass mode, wherein said memory cell array has a first memory cell column composed of said plurality of memory cells arranged in said predetermined direction, and a second memory cell column composed of a plurality of memory cells arranged in said predetermined direction, said plurality of read word lines are respectively connected to said plurality of memory cells in said first and second memory cell columns, said plurality of write word lines are respectively connected to said plurality of memory cells in said first and second memory cell columns, said write bit line includes: a first write bit line which extends from said input buffer circuit to said first memory cell column and transmits data outputted from said input buffer circuit to said first memory cell column; and a second write bit line which extends from said input buffer circuit to said second memory cell column and transmits data outputted from said input buffer circuit to said second memory cell column, said read bit line includes a first read bit line which extends from said first memory cell column to said output buffer circuit and transmits data outputted from said first memory cell column to said output buffer circuit, and a second read bit line which extends from said second memory cell column to said output buffer circuit and transmits data outputted from said second memory cell column to said output buffer circuit, said first write bit line is extended from said first memory cell column to said output buffer circuit, said input buffer circuit outputs data inputted into said input port, to either the first or second write bit line based upon a first selection signal in said write mode, and outputs the data to said first write bit line in said bypass mode while not outputting the data to said second write bit line, and said output buffer circuit outputs either data transmitted through said first or second read bit line to said output port based upon the second selection signal in said read mode, and outputs data transmitted through said first write bit line to said output port in said bypass mode.

4. The semiconductor device according to claim 3, wherein in the layout structure in plan view, said memory cell array is arranged between said input buffer circuit and said output buffer circuit.

* * * * *